(12) United States Patent
Nasu

(10) Patent No.: US 11,955,544 B2
(45) Date of Patent: *Apr. 9, 2024

(54) SEMICONDUCTOR WITH UNIFIED TRANSISTOR STRUCTURE AND VOLTAGE REGULATOR DIODE

(71) Applicant: ROHM CO., LTD., Kyoto (JP)

(72) Inventor: Kentaro Nasu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 212 days.

This patent is subject to a terminal disclaimer.

(21) Appl. No.: 17/454,433

(22) Filed: Nov. 10, 2021

(65) Prior Publication Data

US 2022/0069119 A1 Mar. 3, 2022

Related U.S. Application Data

(63) Continuation of application No. 16/703,579, filed on Dec. 4, 2019, now Pat. No. 11,201,237, which is a
(Continued)

(30) Foreign Application Priority Data

May 18, 2016 (JP) .................................. 2016-099748
Apr. 13, 2017 (JP) .................................. 2017-079993

(51) Int. Cl.
H01L 29/78 (2006.01)
H01L 27/02 (2006.01)
(Continued)

(52) U.S. Cl.
CPC ...... *H01L 29/7808* (2013.01); *H01L 27/0251* (2013.01); *H01L 27/0255* (2013.01);
(Continued)

(58) Field of Classification Search
None
See application file for complete search history.

(56) References Cited

U.S. PATENT DOCUMENTS 4,992,844 A 2/1991 Yakushiji
5,488,236 A 1/1996 Baliga et al.
(Continued)

FOREIGN PATENT DOCUMENTS

CN 1702965 A 11/2005
CN 101794779 8/2010
(Continued)

OTHER PUBLICATIONS

Office Action issued for Chinese Patent Application No. 201710353342. 5, dated Apr. 2, 2020, 16 pages including English translation.
(Continued)

*Primary Examiner* — Bilkis Jahan
(74) *Attorney, Agent, or Firm* — Hamre, Schumann, Mueller & Larson, P.C.

(57) ABSTRACT

A semiconductor device includes a semiconductor layer that has a transistor structure including a p type source region, a p type drain region, an n type body region between the p type source region and the p type drain region, and a gate electrode facing the n type body region and a voltage-regulator diode that is disposed at the semiconductor layer and that has an n type portion connected to the p type source region and a p type portion connected to the gate electrode, in which the transistor structure and the voltage-regulator diode are unified into a single-chip configuration.

12 Claims, 18 Drawing Sheets

Related U.S. Application Data continuation of application No. 15/597,469, filed on May 17, 2017, now Pat. No. 10,522,674.

(51) Int. Cl.
  *H01L 29/16* (2006.01)
  *H01L 29/417* (2006.01)
  *H01L 29/423* (2006.01)
  *H01L 29/866* (2006.01)

(52) U.S. Cl.
  CPC ........ *H01L 29/16* (2013.01); *H01L 29/41758* (2013.01); *H01L 29/4238* (2013.01); *H01L 29/7811* (2013.01); *H01L 29/7813* (2013.01); *H01L 29/866* (2013.01)

(56) References Cited

U.S. PATENT DOCUMENTS

| | | | |
|---|---|---|---|
| 5,548,152 | A | 8/1996 | Arai |
| 5,886,515 | A | 3/1999 | Kelly |
| 6,413,822 | B2 | 7/2002 | Williams et al. |
| 6,495,866 | B2 * | 12/2002 | Kawamoto ........... H01L 29/866 451/36 |
| 10,522,674 | B2 | 12/2019 | Nasu |
| 11,201,237 | B2 * | 12/2021 | Nasu ................... H01L 29/4238 |
| 2001/0045598 | A1 | 11/2001 | Korec et al. |
| 2002/0088991 | A1 * | 7/2002 | Hisamoto ........... H01L 29/7808 257/106 |
| 2002/0175367 | A1 | 11/2002 | Hshieh et al. |
| 2004/0070047 | A1 | 4/2004 | Majumdar et al. |
| 2006/0163658 | A1 | 7/2006 | Anderson et al. |
| 2006/0208340 | A1 | 9/2006 | Glenn et al. |
| 2006/0237786 | A1 | 10/2006 | Ninomiya et al. |
| 2006/0261391 | A1 | 11/2006 | Nakazawa et al. |
| 2007/0176239 | A1 * | 8/2007 | Hshieh .............. H01L 29/66734 257/E29.026 |
| 2010/0046263 | A1 | 2/2010 | Deboy |
| 2010/0224931 | A1 * | 9/2010 | Hsieh .................. H01L 29/7808 257/E27.016 |
| 2012/0326207 | A1 * | 12/2012 | Yoshimochi ........ H01L 29/0653 257/E29.198 |
| 2013/0234238 | A1 * | 9/2013 | Hsieh .................. H01L 29/7813 438/481 |
| 2015/0145025 | A1 * | 5/2015 | Yoshida ............ H01L 29/41741 257/329 |
| 2015/0179633 | A1 | 6/2015 | Mauder et al. |
| 2015/0325504 | A1 | 11/2015 | Ise |
| 2015/0372086 | A1 | 12/2015 | Fachmann et al. |
| 2016/0056144 | A1 | 2/2016 | Yao et al. |
| 2016/0079232 | A1 * | 3/2016 | Shono ................. H01L 29/0649 257/506 |
| 2016/0126235 | A1 | 5/2016 | Nishimura |

FOREIGN PATENT DOCUMENTS

| | | |
|---|---|---|
| CN | 104538395 | 4/2015 |
| JP | S61174672 | 8/1986 |
| JP | 2001326354 | 11/2001 |
| JP | 2011166673 | 8/2011 |
| JP | 2012154119 | 8/2012 |
| JP | 2014017701 | 1/2014 |
| JP | 2014123665 | 7/2014 |
| WO | 2012111285 | 8/2012 |

OTHER PUBLICATIONS

Office Action issued for Japanese Patent Application No. 2017-079993, dated Feb. 4, 2021, 6 pages including English translation.
Second Office Action issued for Chinese Patent Application No. 202011547018.5, dated Sep. 29, 2023, 13 pages including English machine translation.
First Office Action issued for Chinese Patent Application No. 202011547018.5, dated May 15, 2023, 7 pages including English machine translation.

* cited by examiner

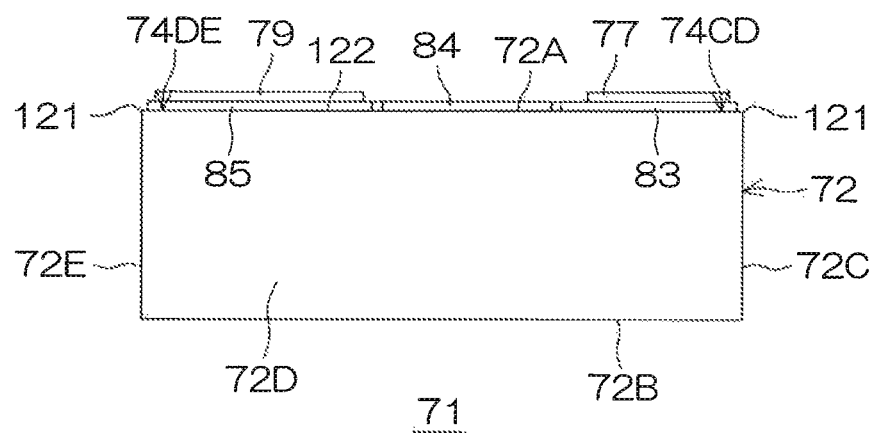
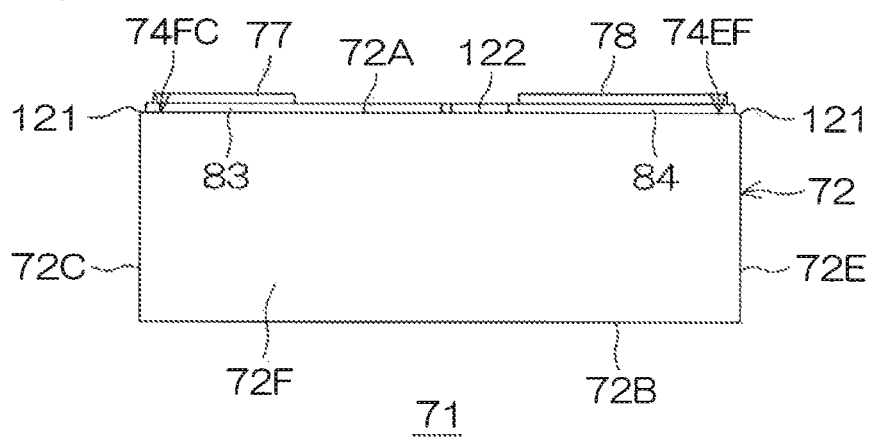

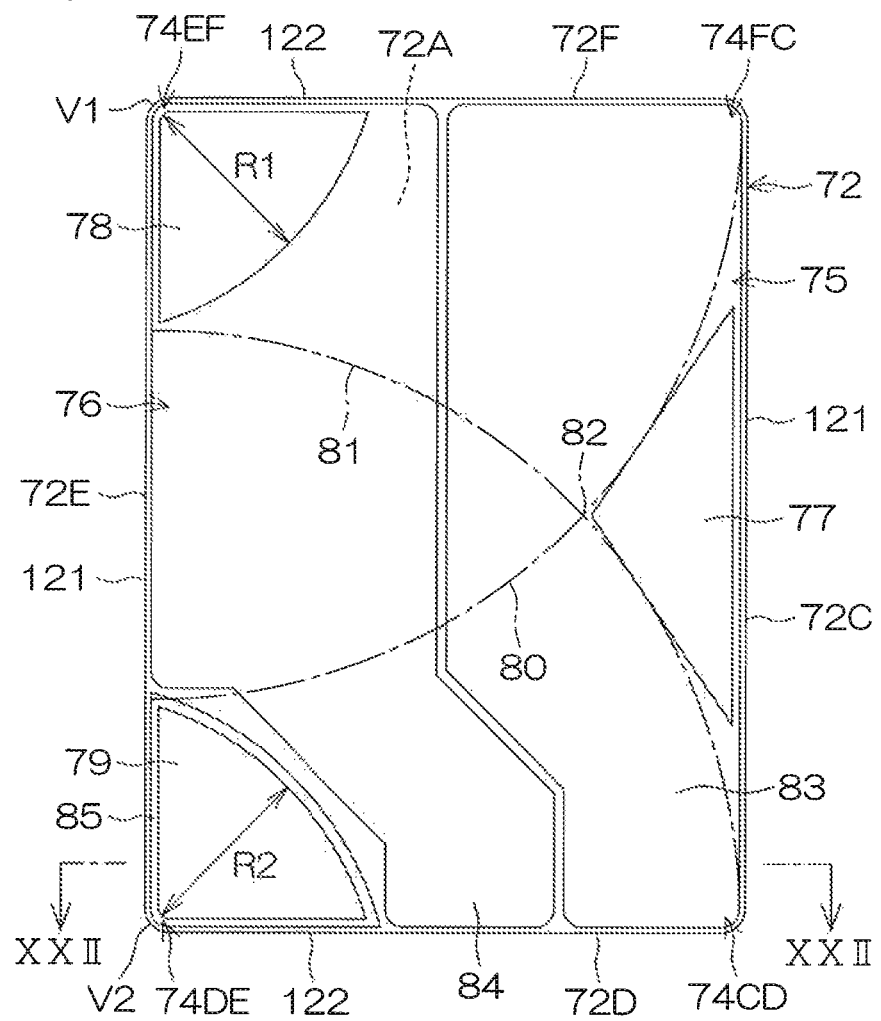

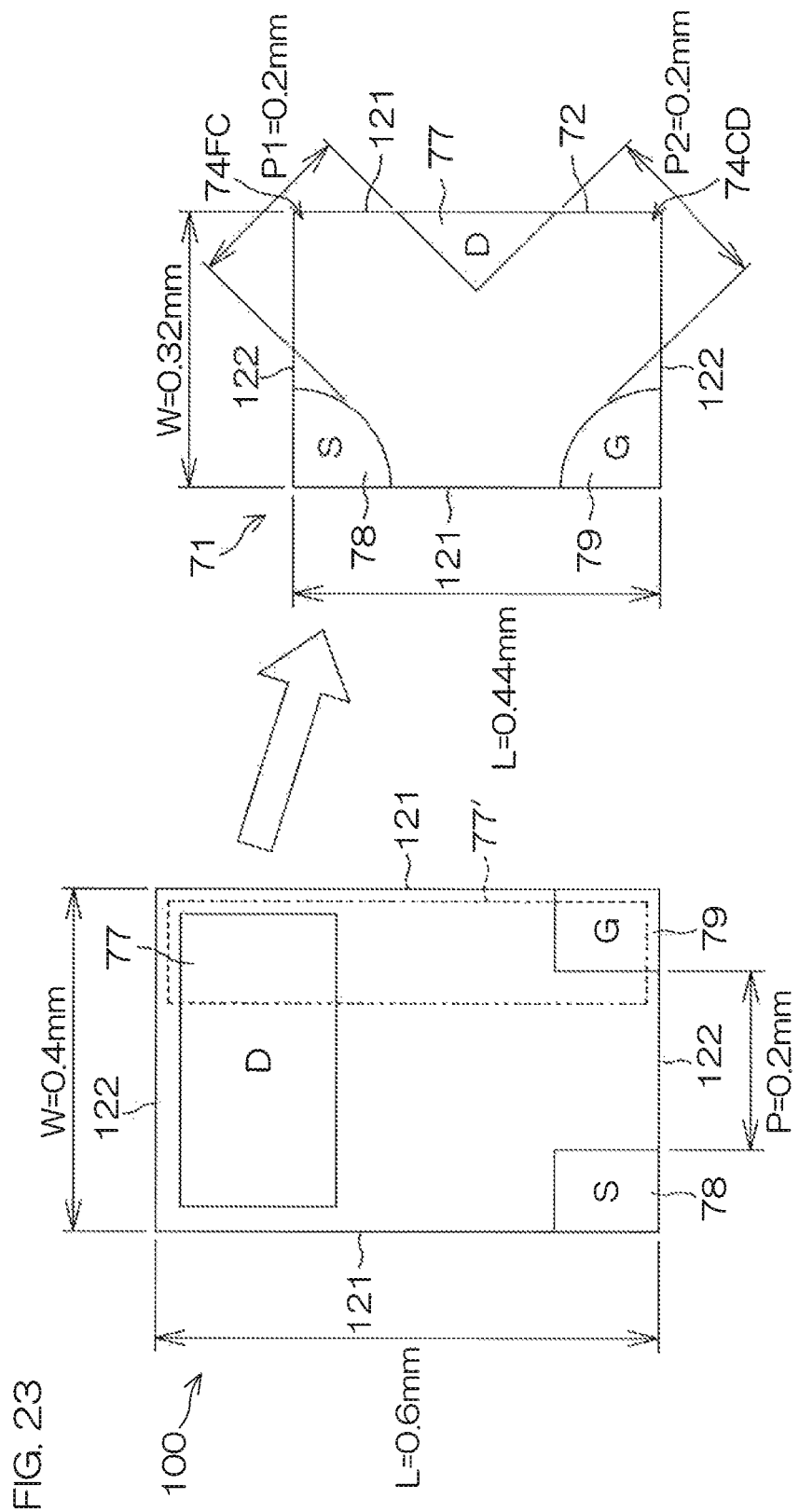

SEMICONDUCTOR WITH UNIFIED TRANSISTOR STRUCTURE AND VOLTAGE REGULATOR DIODE

CROSS-REFERENCE TO RELATED APPLICATIONS

The present application corresponds to Japanese Patent Application No. 2016-099748 filed in the Japan Patent Office on May 18, 2016 and Japanese Patent Application No. 2017-079993 filed in the Japan Patent Office on Apr. 13, 2017, and the entire disclosure of the application is incorporated herein by reference.

TECHNICAL FIELD

The present invention relates to a semiconductor device that has a transistor structure and a voltage-regulator diode in a single chip.

BACKGROUND ART

An element that protects an IC (Integrated Circuit) has been heretofore incorporated into various control circuits. For example, Patent Document 1 (Japanese Patent Application Publication No. 2012-154119) and Patent Document 2 (Japanese Patent Application Publication No. 2014-17701) each disclose a diode as such an IC-protecting element.

SUMMARY OF INVENTION

A consumption current of an IC tends to increase as a result of an increase in function of a sensor, a display for portable devices, a camera for portable devices, etc., that are controlled by the IC. Therefore, if a diode is used as an IC-protecting element, the chip size of the protecting element will be required to be made large in accordance with the consumption current of the IC, thus making it difficult to meet the demand of a reduction in size of devices.

On the other hand, a transistor can achieve low power consumption even if it is smaller in size than a diode, and hence has a potential as an alternative element of the diode. However, in a single transistor, it is difficult to develop the characteristics of reverse voltage prevention and overvoltage protection that are required to protect an IC.

An object of the present invention is to provide a semiconductor device that is produced by unifying a transistor and a voltage-regulator diode into a single-chip configuration and that is capable of achieving low power consumption and developing reverse voltage prevention and overvoltage protection with respect to an external device, such as an IC.

BRIEF DESCRIPTION OF DRAWINGS

FIG. 16 is a front view of the semiconductor device of FIG. 15.

FIG. 17 is a back view of the semiconductor device of FIG. 15.

FIG. 18 is a plan view of the semiconductor device of FIG. 15.

FIG. 23 is a view to make a comparison between the chip size of the semiconductor device of FIG. 15 and that of a semiconductor device according to a reference example.

DESCRIPTION OF EMBODIMENTS

Figure 1:
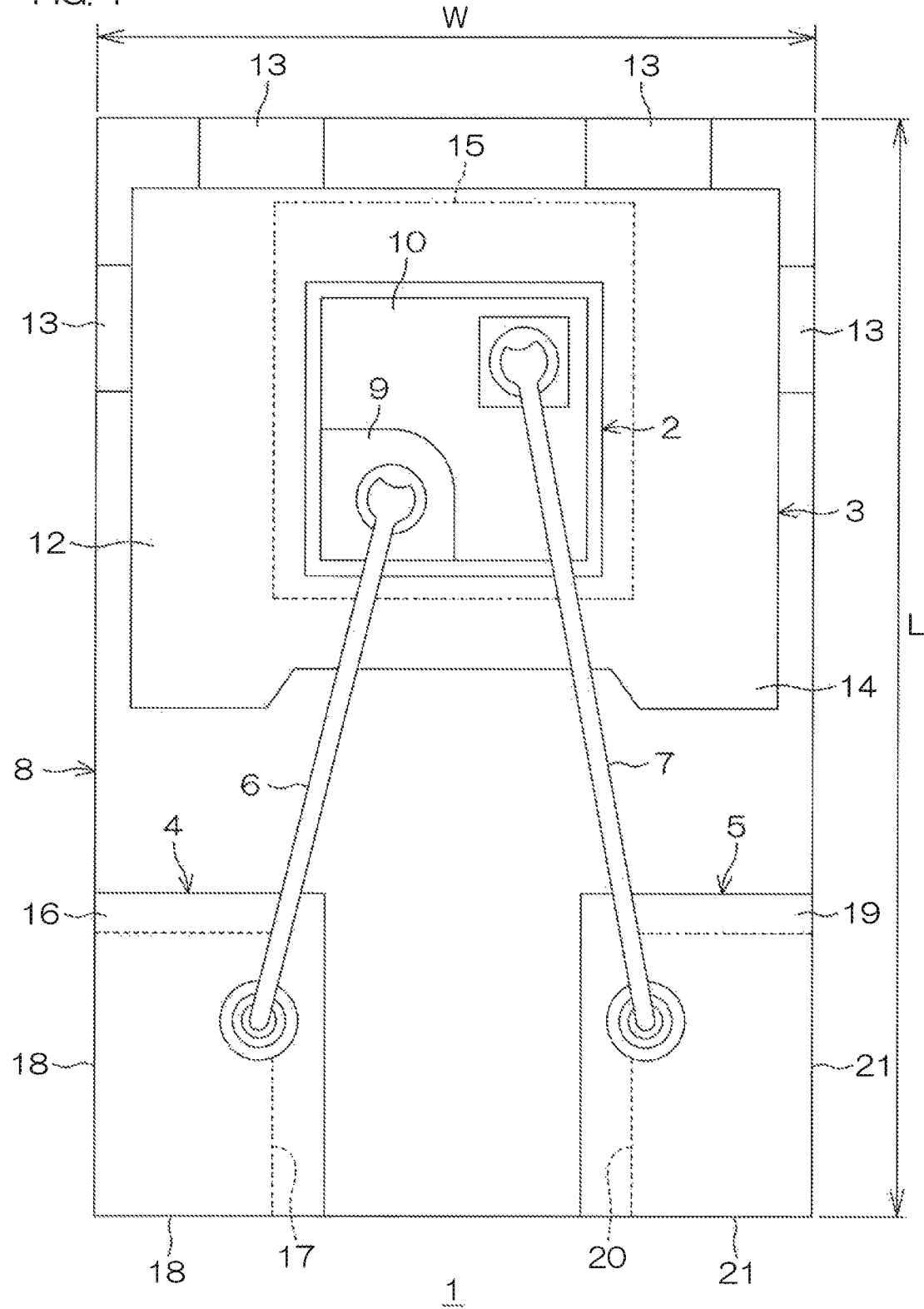
FIG. 1 is a schematic plan view of a semiconductor device according to one preferred embodiment of the present invention.

A semiconductor device according to one preferred embodiment of the present invention includes a semiconductor layer that has a transistor structure including a p type source region, a p type drain region, an n type body region between the p type source region and the p type drain region, and a gate electrode facing the n type body region and a voltage-regulator diode that is disposed at the semiconductor layer and that has an n type portion connected to the p type source region and a p type portion connected to the gate electrode, in which the transistor structure and the voltage-regulator diode are unified into a single-chip configuration.

The transistor structure of the semiconductor device includes a p channel type MISFET that induces a positive hole in an n type body region directly under a gate electrode and that is brought into an ON state either by applying a voltage that becomes negative with respect to a source to the gate electrode or by applying a positive voltage (a gate is set at a ground (0 V)) to the source.

For example, if a voltage by which the p type drain region becomes positive (+) and by which the p type source region becomes negative (−) is applied in a state in which the gate electrode is grounded at a ground potential, a forward bias will be applied to a parasitic diode (a pn diode consisting of a pn junction portion of both the p type drain region and the n type body region) built into the transistor structure. As a result, an electric current flows from the drain side to the source side through the parasitic diode. The current flow from the drain side to the source side brings the source into a positive electric potential with respect to the gate (i.e., the gate becomes negative with respect to the source), and, as a result, a positive hole is induced in the n type body region directly under the gate electrode, and the transistor reaches an ON state. Therefore, when the semiconductor device is used by being connected to an external device, such as IC, it is possible to pass a forward current through the transistor structure that has a smaller loss and that is lower in power consumption than a diode, and therefore it is possible to employ a small-sized chip. As a result, it is possible to achieve space-saving in electronic equipment or the like.

On the other hand, if a load that is controlled by an IC is inductive, a counter electromotive force occurs in the load when an electric current flowing through the load is shut off. Because of this counter electromotive force, there is a case in which a voltage by which the p-type-source-region side becomes positive (+) is applied between the p type source region and the p type drain region. In this case, a reverse bias is applied to the parasitic diode, and therefore an electric current does not flow through an internal circuit of the IC, and, as a result, it is possible to protect the IC. At this time, the reverse bias is also applied to the pn junction portion of both the p type portion and the n type portion of the voltage-regulator diode. Therefore, when the counter electromotive force of the load is large or when a large voltage, such as static electricity or surge voltage, is applied, the voltage-regulator diode undergoes a Zener breakdown, and a reverse current flows to the gate side (ground potential side) through the voltage-regulator diode, and therefore it is possible to prevent a heavy electric current from flowing to the IC.

Accordingly, if the semiconductor device according to one preferred embodiment of the present invention is used as a protecting element of an IC of electronic equipment or the like, it is possible to develop reverse voltage prevention and overvoltage protection with respect to an external device, such as IC, although its power consumption is low, and therefore it is possible to maintain a protective function as a protecting element. Moreover, the transistor structure and the voltage-regulator diode are unified into a single-chip configuration, and therefore it is possible to achieve more excellent space-saving than in a case in which these are mounted in equipment as different chips.

In the semiconductor device according to one preferred embodiment of the present invention, the semiconductor layer may include an active region including the transistor structure and an outer peripheral region surrounding the active region, and the voltage-regulator diode may include an outer peripheral diode disposed along the outer peripheral region.

According to this arrangement, it is possible to increase the junction area of both the p type portion and the n type portion of the voltage-regulator diode, and therefore it is possible to reduce the resistance value of the voltage-regulator diode, and it is possible to reduce power consumption. As a result, it is possible to reduce a loss in the voltage-regulator diode, and it is possible to prevent a thermal breakdown.

In the semiconductor device according to one preferred embodiment of the present invention, in the outer peripheral diode, the p type portion and the n type portion may be each formed in a shape surrounding the active region.

According to this arrangement, the pn junction portion of both the p type portion and the n type portion of the voltage-regulator diode has an integral structure that surrounds the active region, and therefore it is possible to further reduce a loss in the voltage-regulator diode.

In the semiconductor device according to one preferred embodiment of the present invention, the p type portion and the n type portion may each have a width equal to each other.

In the semiconductor device according to one preferred embodiment of the present invention, in the outer peripheral diode, the n type portion may be disposed at a more inward side than the p type portion.

In the semiconductor device according to one preferred embodiment of the present invention, the voltage-regulator diode may be made of polysilicon stacked on the semiconductor layer.

According to this arrangement, the voltage-regulator diode is made of polysilicon that is general as material for the gate electrode, and, as a result, it is possible to form the gate electrode and the voltage-regulator diode in the same process step.

In the semiconductor device according to one preferred embodiment of the present invention, the transistor structure may include a trench gate structure made of polysilicon as the gate electrode embedded in a gate trench which is formed at the semiconductor layer.

In the semiconductor device according to one preferred embodiment of the present invention, the voltage-regulator diode may be made of an impurity region disposed in the semiconductor layer.

In the semiconductor device according to one preferred embodiment of the present invention, a breakdown voltage of the voltage-regulator diode may be 8 V or less.

In the semiconductor device according to one preferred embodiment of the present invention, the semiconductor device may have a length-breadth chip size of 0.6 mm×0.4 mm or less.

If the semiconductor device has this size, it is possible to reduce the size of electronic equipment in which the semiconductor device is mounted.

A preferred embodiment of the present invention will be hereinafter described in detail with reference to the accompanying drawings.

Figure 2:
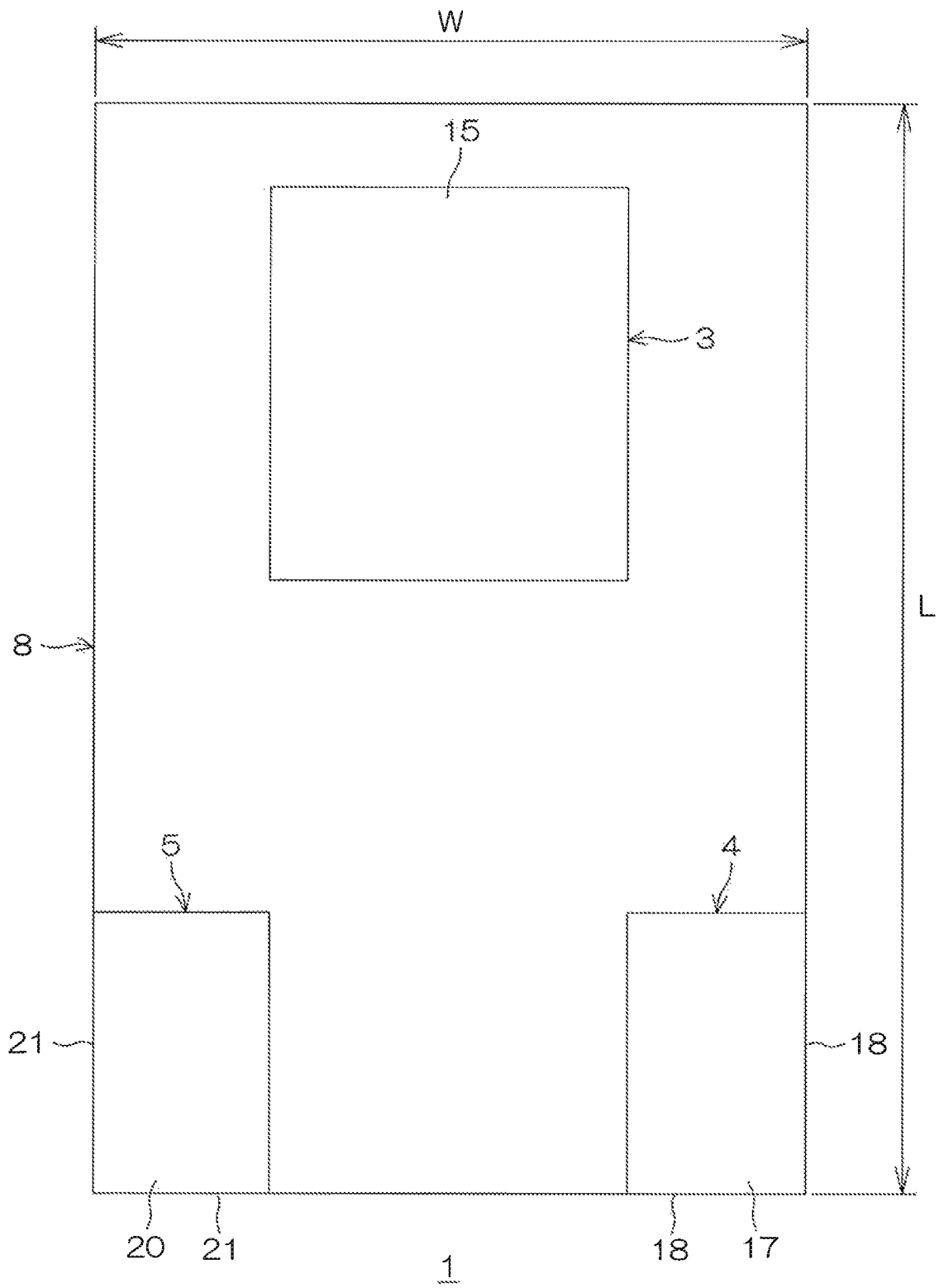
FIG. 2 is a schematic bottom view of the semiconductor device according to one preferred embodiment of the present invention.

FIG. 1 is a schematic plan view of a semiconductor device 1 according to one preferred embodiment of the present invention. FIG. 2 is a schematic bottom view of the semiconductor device 1 according to one preferred embodiment of the present invention. In FIG. 1, the inside of a package is depicted in a see-through state so that the structure of the semiconductor device 1 can be easily understood.

The semiconductor device 1 is arranged as a comparatively small-sized semiconductor device that is capable of employing a so-called surface mount technology. As an example of the dimensions of the semiconductor device 1, the size L in the longitudinal direction is about 0.6 mm, the size W in the width direction is about 0.4 mm, and the size in the thickness direction is about 0.36 mm.

The semiconductor device 1 includes a semiconductor element 2, a main lead 3, a first sub-lead 4, a second sub-lead 5, a first wire 6, a second wire 7, and a resin package 8.

The semiconductor element 2 is arranged as a so-called transistor. A gate metal 9 and a source metal 10 are formed on an obverse surface of the semiconductor element 2. A drain electrode 11 (described later) is formed on a reverse surface of the semiconductor element 2 although it is not shown in FIG. 1 and FIG. 2.

The main lead 3 is disposed at an end in the longitudinal direction of the resin package 8. In the opposite end in the longitudinal direction thereof, the first sub-lead 4 and the second sub-lead 5 are disposed at both corner parts of the resin package 8, respectively.

The main lead 3 supports the semiconductor element 2 from its reverse surface side, and is electrically connected to the drain electrode 11 (described later). The main lead 3 includes a main portion 12 formed in a substantially quadrangular shape in a plan view and a plurality of projecting portions 13 that selectively protrude from an end surface of the main portion 12.

The main portion 12 has its obverse surface 14 to which the semiconductor element 2 is bonded, and has its reverse surface 15 that is exposed from an outer surface of the resin package 8. As is apparent from FIG. 1, the obverse surface 14 is larger than the reverse surface 15 in comparison between the magnitude of the obverse surface 14 and that of the reverse surface 15 of the main portion 12. For example, the reverse surface 15 is arranged so as to be slightly larger in size than the semiconductor element 2 in such a way that its outer edge surrounds the semiconductor element 2, and the obverse surface 14 is arranged so as to be even larger in size than the reverse surface 15. In other words, in the main portion 12, a support region of the semiconductor element 2 forming the reverse surface 15 is formed so as to be selectively thick, and a part of this region is exposed from the outer surface of the resin package 8 as the reverse surface 15. The reverse surface 15 is used as a drain terminal of the semiconductor device 1.

The projecting portion 13 protrudes, for example, from an end surface of the main portion 12 that is on the side opposite to the first sub-lead 4 and to the second sub-lead 5 and from both end surfaces beside the end surface located on the side opposite thereto. In other words, in the main portion 12, the projecting portions 13 protrude from all end surfaces, respectively, excluding the end surface facing the first and second sub-leads 4 and 5 in the present preferred embodiment. Each projecting portion 13 is exposed from the outer surface of the resin package 8.

The first sub-lead 4 is formed in a quadrangular shape in a plan view. The first wire 6 is connected to an obverse surface 16 of the first sub-lead 4. The first wire 6 is connected to the gate metal 9. As a result, the first sub-lead 4 is electrically connected to the gate metal 9 through the first wire 6. In the first sub-lead 4, a region forming a reverse surface 17 is formed so as to be selectively thick, and a part of this region is exposed from the outer surface of the resin package 8 as the reverse surface 17 in the same way as in the main portion 12. Two side surfaces 18 and 18 of the first sub-lead 4 are exposed from the outer surface of the resin package 8 so as to form a corner portion of the resin package 8. The reverse surface 17 and the side surfaces 18 and 18 exposed from the outer surface of the resin package 8 are used as a gate terminal of the semiconductor device 1.

The second sub-lead 5 is formed in a quadrangular shape in a plan view. The second wire 7 is connected to an obverse surface 19 of the second sub-lead 5. The second wire 7 is connected to the source metal 10. As a result, the second sub-lead 5 is electrically connected to the source metal 10 through the second wire 7. In the second sub-lead 5, a region forming a reverse surface 20 is formed so as to be selectively thick, and a part of this region is exposed from the outer surface of the resin package 8 as the reverse surface 20 in the same way as in the main portion 12. Two side surfaces 21 and 21 of the second sub-lead 5 are exposed from the outer surface of the resin package 8 so as to form a corner portion of the resin package 8. The reverse surface 20 and the side surfaces 21 and 21 exposed from the outer surface of the resin package 8 are used as a source terminal of the semiconductor device 1.

The main lead 3, the first sub-lead 4, and the second sub-lead 5 can be formed together by applying patterning, such as etching, to a metallic plate made of, for example, Cu.

The resin package 8 covers the semiconductor element 2, apart of the main lead 3, a part of the first sub-lead 4, a part of the second sub-lead 5, the first wire 6, and the second wire 7, and is made of, for example, black epoxy resin.

Figure 3:
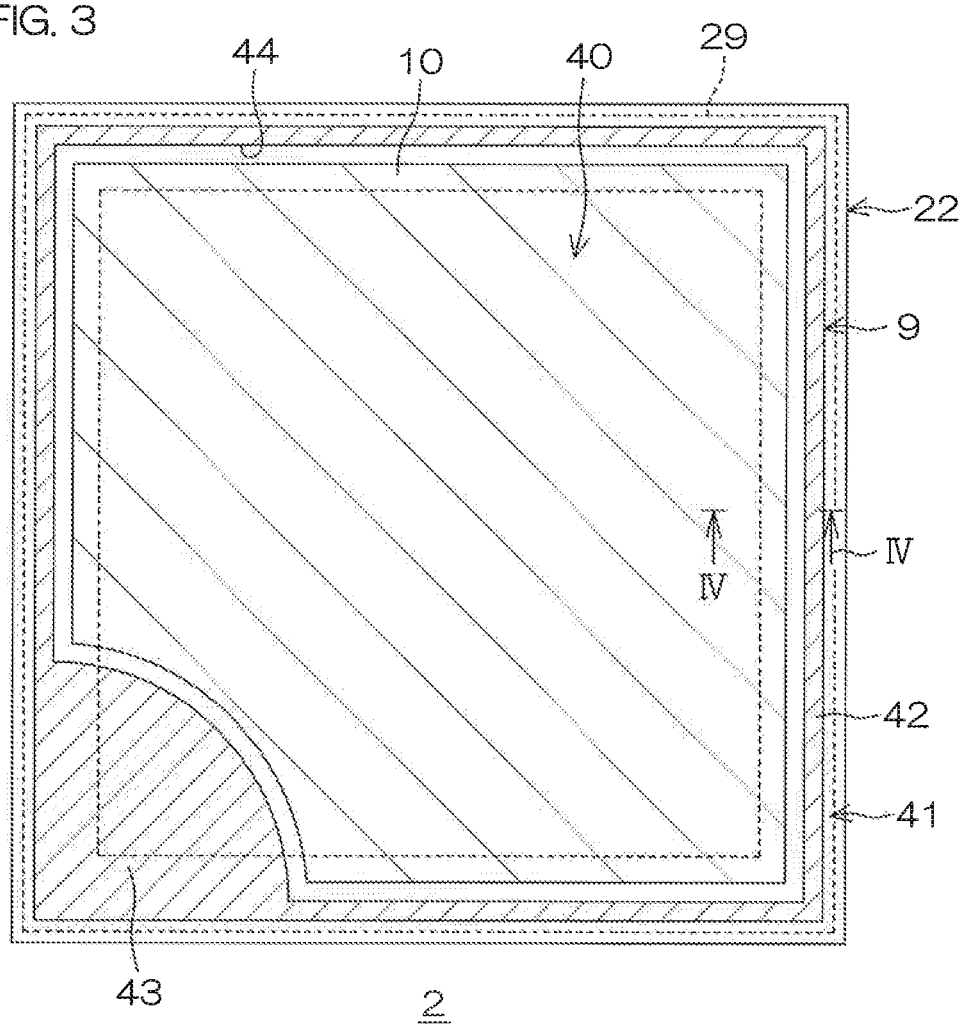
FIG. 3 is a schematic plan view of a semiconductor element of FIG. 1.
Figure 4:
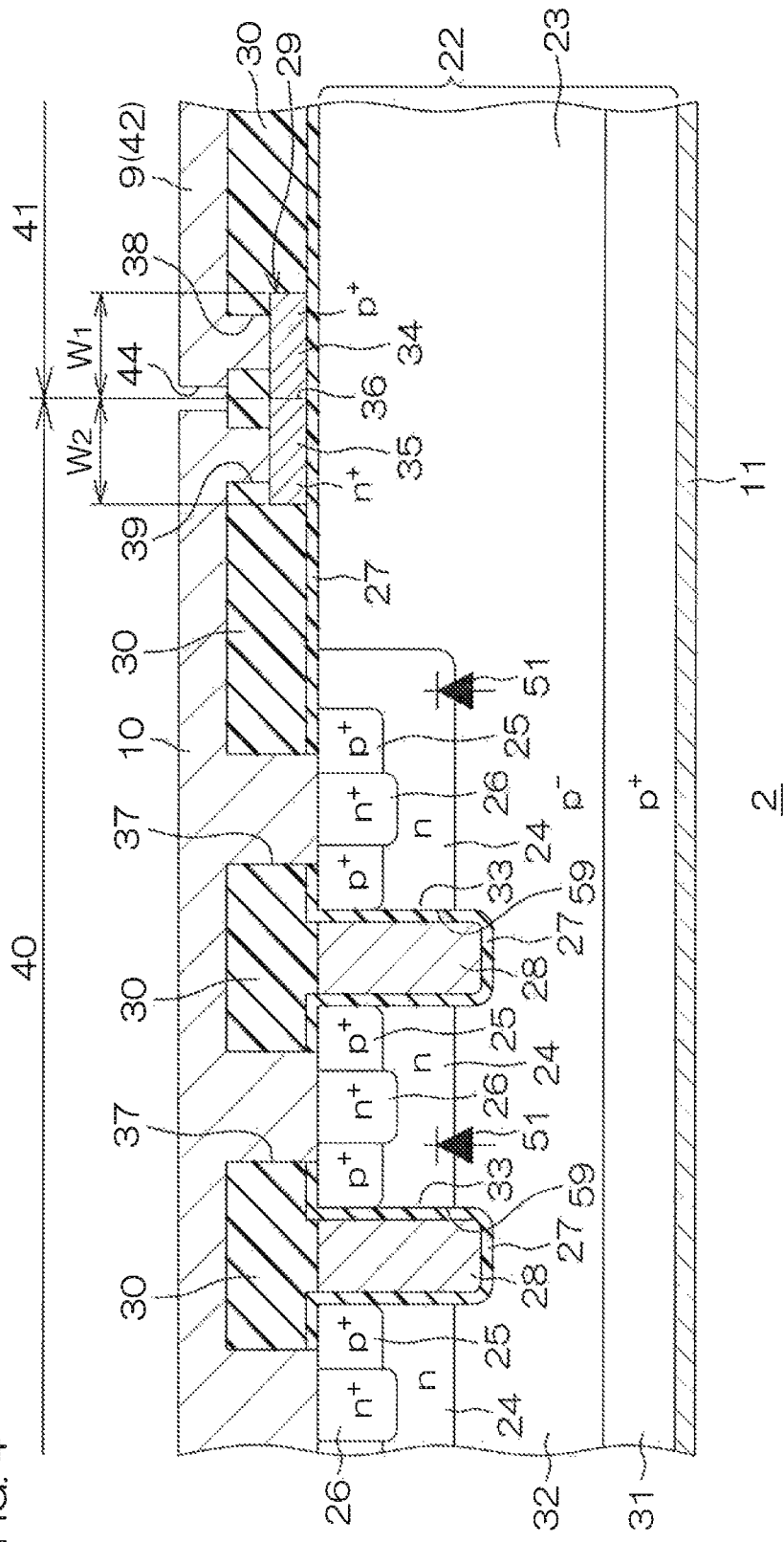
FIG. 4 is a view showing a cross section in a cutting plane along line IV-IV of FIG. 3.
Figure 5:
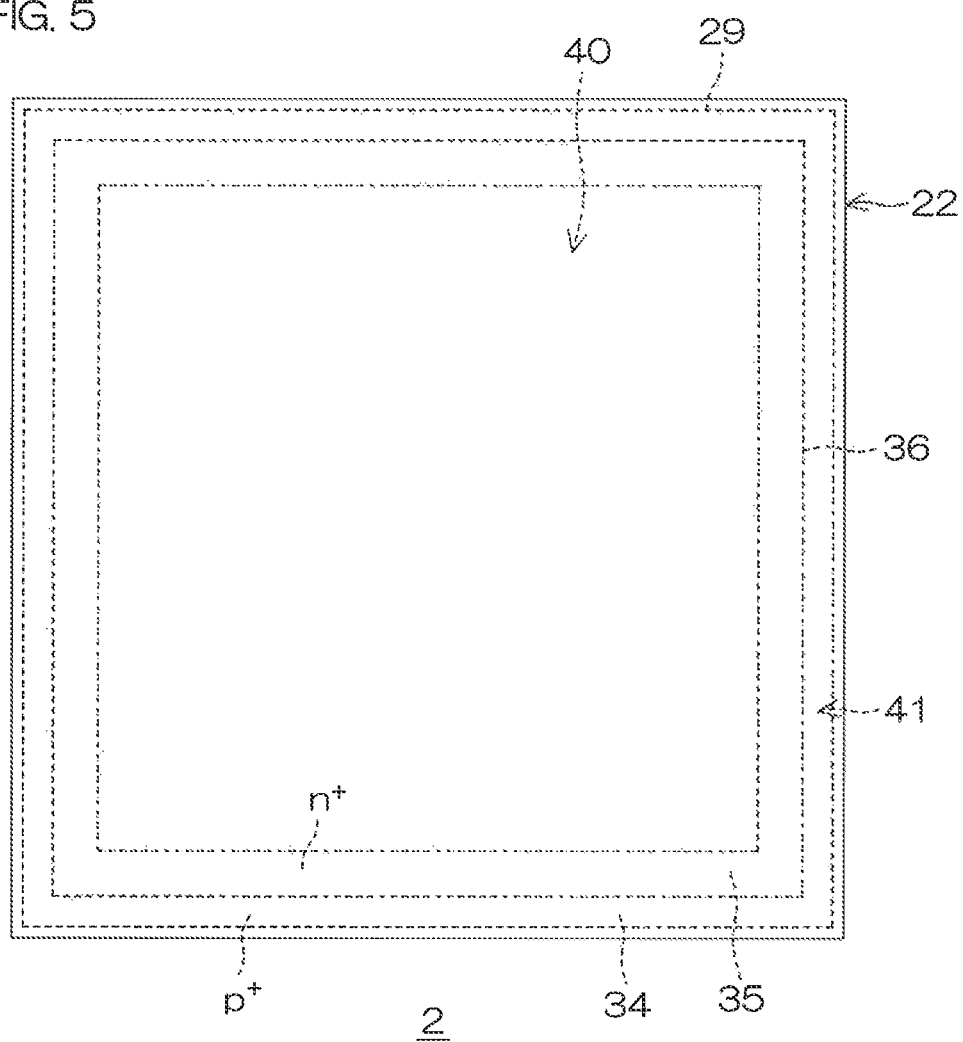
FIG. 5 is a schematic view to describe a planar shape of a voltage-regulator diode.

FIG. 3 is a schematic plan view of the semiconductor element 2 of FIG. 1. FIG. 4 is a view showing a cross section in a cutting plane along line IV-IV of FIG. 3. FIG. 5 is a schematic view to describe a planar shape of a voltage-regulator diode.

The semiconductor element 2 is an element provided with a p type channel MISFET of a trench gate structure, and includes a semiconductor layer 22, a p$^-$ type drain region 23, an n type body region 24, a p$^+$ type source region 25, an n$^+$ type body contact region 26, a gate insulating film 27, a gate electrode 28, the voltage-regulator diode 29, an interlayer insulating film 30, the gate metal 9, the source metal 10, and the drain electrode 11.

The semiconductor layer 22 may include, for example, a p$^+$ type substrate 31 and a p$^-$ type epitaxial layer 32 formed by growing a semiconductor crystal on the p$^+$ type substrate 31. The p$^+$ type substrate 31 and the p$^-$ type epitaxial layer 32 are each made of silicon (Si) in the present preferred embodiment, and yet may be each made of another semiconductor (e.g., SiC, GaN, or the like). With respect to the p$^+$ type substrate 31, its thickness may be about 40 μm to 250 μm, and its p type impurity concentration may be about $1 \times 10^{21}$ cm$^{-3}$ to $1 \times 10^{22}$ cm$^{-3}$. On the other hand, with respect to the p$^-$ type epitaxial layer 32, its thickness may be about 3 μm to 8 μm, and its p type impurity concentration may be about $1 \times 10^{16}$ cm$^{-3}$ to $1 \times 10^{17}$ cm$^{-3}$. The semiconductor layer 22 is provided to set an active region 40 in which a transistor structure is chiefly disposed and an outer peripheral region 41 that surrounds the active region 40.

The p$^-$ type drain region 23 is an impurity region that occupies a great part of the p$^-$ type epitaxial layer 32 in the active region 40. As described later, in the present preferred embodiment, impurity regions, such as the n type body region 24, the p$^+$ type source region 25, and the n$^+$ type body contact region 26, are selectively formed at the p$^-$ type epitaxial layer 32, and yet a p$^-$ type region excluding these impurity regions 24 to 26 may be the p$^-$ type drain region 23. Therefore, the p$^-$ type drain region 23 may have a p type impurity concentration of $1 \times 10^{16}$ cm$^{-3}$ to $1 \times 10^{17}$ cm$^{-3}$.

The n type body region 24 is an impurity region selectively formed at a surface part of the p$^-$ type epitaxial layer 32 in the active region 40. As a result, a pn diode (parasitic diode 51) consisting of a pn junction portion of both the p$^-$ type drain region 23 and the n type body region 24 is built into the semiconductor element 2. The n type body region 24 may have an n type impurity concentration of $2 \times 10^{16}$ cm$^{-3}$ to $2 \times 10^{17}$ cm$^{-3}$.

The p$^+$ type source region 25 is an impurity region formed at a surface part of the n type body region 24. The p$^+$ type source region 25 may have a p type impurity concentration of $1 \times 10^{21}$ cm$^{-3}$ to $5 \times 10^{21}$ cm$^{-3}$.

The n$^+$ type body contact region 26 is an impurity region that reaches the n type body region 24 from a surface of the p⁻ type epitaxial layer 32 through the p⁺ type source region 25. As a result, the n type body region 24 is electrically connectable from the surface side of the p⁻ type epitaxial layer 32 through the n⁺ type body contact region 26. The n⁺ type body contact region 26 may have an n type impurity concentration of $1\times10^{21}$ cm⁻³ to $5\times10^{21}$ cm⁻³.

A gate trench 59 that passes through the p⁺ type source region 25 and through the n type body region 24 from a surface of the semiconductor layer 22 and then reaches the p⁻ type drain region 23 is formed at the semiconductor layer 22. The gate trench 59 may be formed in a grid-shaped manner or in a stripe manner in the surface part of the p⁻ type epitaxial layer 32. As a result, the plurality of n type body regions 24 may be arranged in a matrix manner or in a stripe manner in a plan view. In the n type body region 24, a channel region 33 is formed at a side part of the gate trench 59.

The gate insulating film 27 is made of, for example, silicon oxide ($SiO_2$), and is formed at an inner surface of the gate trench 59. The gate insulating film 27 is formed so as to extend to the outer peripheral region 41 in addition to the active region 40. In other words, an insulating film formed in the same process step is formed in the active region 40 and the outer peripheral region 41. Although the insulating film lying on the outer peripheral region 41 is called the gate insulating film 27 in the present preferred embodiment, the insulating film thereon may be called another name because the gate insulating film 27 does not contribute to the switching of a transistor structure.

The gate electrode 28 is made of, for example, polysilicon, and is embedded in the gate trench 59 with the gate insulating film 27 therebetween. The gate electrode 28 faces the channel region 33 with the gate insulating film 27 therebetween.

The voltage-regulator diode 29 is made of polysilicon in the present preferred embodiment, and is formed on the gate insulating film 27. It is possible to form the voltage-regulator diode 29 in the same process step as the gate electrode 28. As shown in FIG. 5, the voltage-regulator diode 29 is arranged as an outer peripheral diode formed at a peripheral edge of the semiconductor element 2 along the outer peripheral region 41. The voltage-regulator diode 29 serving as an outer peripheral diode may be disposed such that its whole is placed in the outer peripheral region 41, or may be disposed such that its part is placed in the outer peripheral region 41 whereas the remaining parts are placed in the active region 40 as shown in FIG. 4 and FIG. 5. In other words, the voltage-regulator diode 29 may be formed so as to extend between the active region 40 and the outer peripheral region 41.

The voltage-regulator diode 29 includes a p type portion 34 and an n type portion 35. The p type portion 34 and the n type portion 35 are each made of an impurity region in a polysilicon film, and the voltage-regulator diode 29 is made of the p type portion 34 and the n type portion 35 that serve as a pair and that are adjacent to each other. The p type portion 34 and the n type portion 35 are each formed in an annular shape that surrounds the active region 40. As a result, a pn junction portion 36 between these p and n type portions 34, 35 has an integral structure formed in an annular shape surrounding the active region 40. In the present preferred embodiment, the p type portion 34 and the n type portion 35 may have a width $W_1$ and a width $W_2$, respectively, that are equal to each other. Additionally, with respect to a disposition form, the n type portion 35 may be placed at a more inward side than the p type portion 34. The p type portion 34 is connected to the gate metal 9 as described later, and therefore it is possible to simplify a connection structure between the p type portion 34 and a gate finger 42 (described later) drawn around to the peripheral edge of the semiconductor element 2 by placing the p type portion 34 at an outer position. For example, it is only necessary to extend a contact directly downwardly from the gate finger 42.

The breakdown voltage Vz of the voltage-regulator diode 29 is set to be, for example, 10 V or less, preferably 6.8 V to 8 V. It is possible to realize the breakdown voltage Vz falling within this range, for example, by appropriately setting a p type impurity concentration of the p type portion 34 and an n type impurity concentration of the n type portion 35. For example, it is possible to realize it by setting the p type impurity concentration of the p type portion 34 at $1\times10^{16}$ cm⁻³ to $1\times10^{17}$ cm⁻³ and by setting the n type impurity concentration of the n type portion 35 at $1\times10^{21}$ cm⁻³ to $5\times10^{21}$ cm⁻³.

The interlayer insulating film 30 is made of, for example, silicon oxide ($SiO_2$), and is formed on the p⁻ type epitaxial layer 32 so as to cover the gate electrode 28 and the voltage-regulator diode 29. A contact hole 37 by which the p⁺ type source region 25 and the n⁺ type body contact region 26 are exposed, a contact hole 38 by which the p type portion 34 of the voltage-regulator diode 29 is exposed, and a contact hole 39 by which the n type portion 35 of the voltage-regulator diode 29 is exposed are formed in the interlayer insulating film 30.

The gate metal 9 and the source metal 10 are each made of an electrode film formed on the interlayer insulating film 30. It is possible to form the gate metal 9 and the source metal 10 by depositing a material for the electrode film (for example, a metal that includes μl) on the interlayer insulating film 30 according to a sputtering method or the like and then applying patterning, such as etching, to the electrode film. In other words, the gate metal 9 and the source metal 10 may be formed in the same process step.

The gate metal 9 includes a gate finger 42 and a gate pad 43.

As shown in FIG. 3, the gate finger 42 is formed in a substantially quadrangular ring shape along the peripheral edge of the semiconductor element 2 in a plan view, and the active region 40 is set in a region surrounded by the gate finger 42. The gate finger 42 is connected to the p type portion 34 of the voltage-regulator diode 29 through the contact hole 38. Additionally, the gate finger 42 is connected to the gate electrode 28 through a contact hole (not shown) formed in the interlayer insulating film 30.

The gate pad 43 is disposed at one corner portion of the gate finger 42. The gate pad 43 is formed so as to be integrally continuous with the gate finger 42. The first wire 6 mentioned above is connected to the gate pad 43.

The source metal 10 is disposed in a region surrounded by the gate finger 42 and the gate pad 43. The source metal 10 is separated from the gate finger 42 and from the gate pad 43 by means of a removal region 44 formed by etching the electrode film. The source metal 10 is connected to the p⁺ type source region 25 and to the n⁺ type body contact region 26 through the contact hole 37, and is connected to the n type portion 35 of the voltage-regulator diode 29 through the contact hole 39.

The drain electrode 11 is made of, for example, the same material as the gate metal 9 and as the source metal 10, and may be formed at the entire reverse surface of the p⁺ type substrate 31.

The semiconductor device 1 described above is usable as a protecting element of an IC (Integrated Circuit) mounted in general electronic equipment, such as a cellular phone, a smartphone, a digital camera, and a video camera, and is best suited to the cellular phone and the smartphone that will be facilitated to be reduced in size from the fact that the semiconductor device 1 is a comparatively small-sized semiconductor device.

Figure 6:
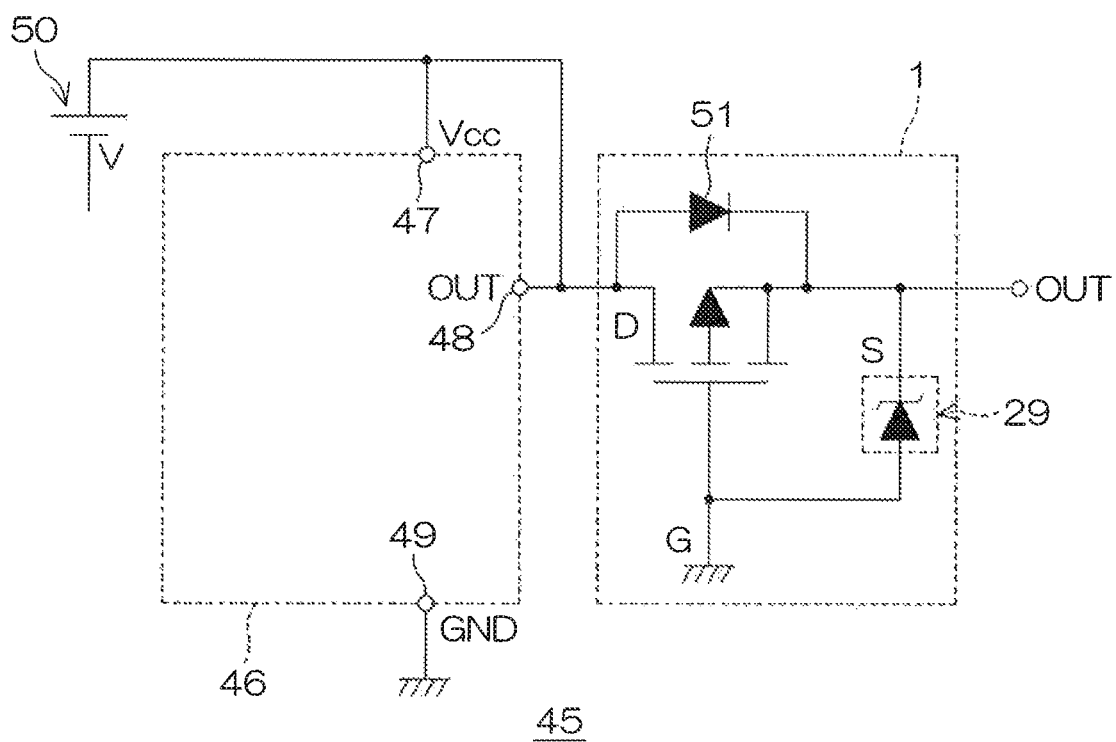
FIG. 6 is a view showing a part of a protection circuit to which the semiconductor device of FIG. 1 is connected.

Next, the operation of circuit protection by the semiconductor device 1 will be described with reference to FIG. 6. FIG. 6 is a view showing a part of a protection circuit to which the semiconductor device 1 of FIG. 1 is connected. The protection circuit diagram of FIG. 6 is merely one usage example of the semiconductor device 1, and the connection mode of the semiconductor device 1 is not limited to the arrangement of FIG. 6.

The protection circuit 45 shown in FIG. 6 includes an IC 46 and the semiconductor device 1.

For example, the IC 46 may be one of various general-purpose ICs, such as a power management IC and a transmission/reception control IC of a smartphone. The IC 46 has, for example, a power supply terminal 47 (Vcc), an output terminal 48 (OUT), and a ground terminal 49 (GND). The power supply terminal 47 is connected to a power source 50, and the ground terminal 49 is grounded to the ground potential.

The drain terminal D (the main lead 3 of FIG. 2) of the semiconductor device 1 is connected to the output terminal 48 of the IC 46, and the source terminal S (the second sub-lead 5 of FIG. 2) is connected to a load (not shown) as an output terminal (OUT) of the semiconductor device 1. The gate terminal G (the first sub-lead 4 of FIG. 2) of the semiconductor device 1 is grounded to the ground potential.

Referring to FIG. 6, in the protection circuit 45, a voltage by which the drain terminal D becomes positive (+) and by which the source terminal S becomes negative (−) is applied. In other words, a voltage by which the p− type drain region 23 becomes positive (+) and by which the p+ type source region 25 becomes negative (−) is applied, and therefore a forward bias is applied to a parasitic diode 51 built into the semiconductor element 2. As a result, an electric current flows from the drain-terminal-D side to the source-terminal-S side through the parasitic diode 51. The current flow from the drain-terminal-D side to the source-terminal-S side brings the source into a positive potential with respect to the gate (i.e., the gate becomes negative with respect to the source), and, as a result, a positive hole is induced in the n type channel region 33 (see FIG. 4) directly under the gate electrode 28, and the transistor reaches an ON state.

Figure 7:
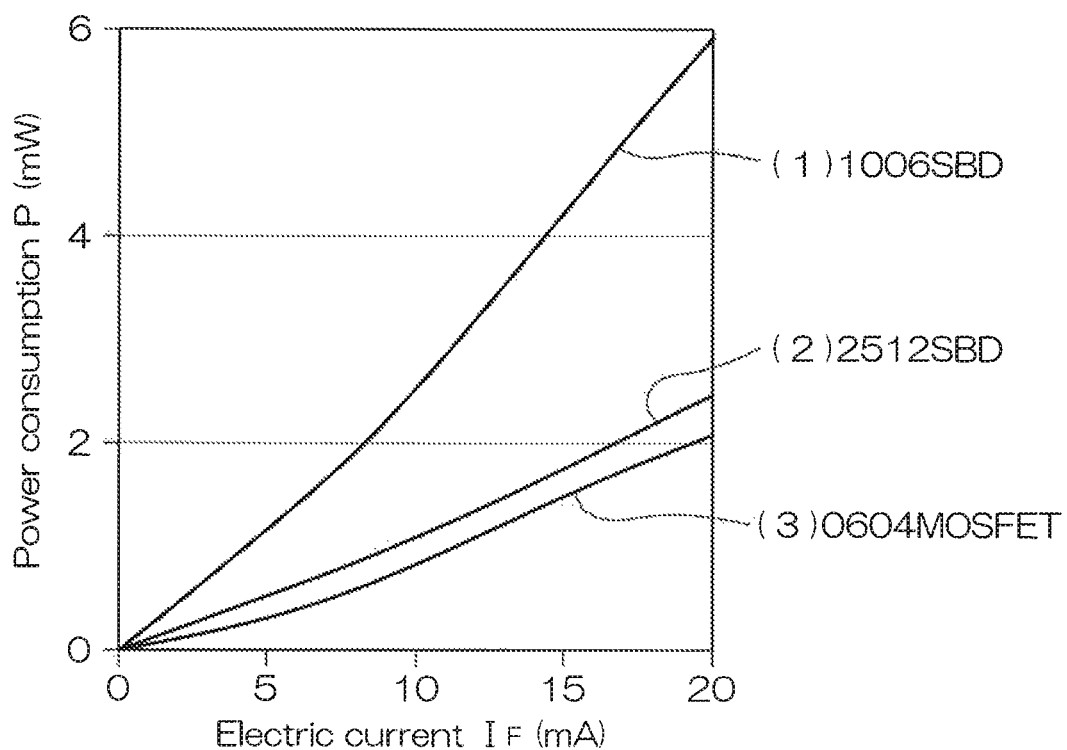
FIG. 7 is a view to make a comparison between the power consumption of a MOSFET and that of a Schottky barrier diode (SBD).

Here, FIG. 7 is a view to make a comparison between the power consumption of a MOSFET and that of a Schottky barrier diode (SBD). In FIG. 7, solid lines (1), (2), and (3) represent relationships between electric current and power consumption of a Schottky barrier diode of size 1006 (length×breadth=1.0 mm×0.6 mm), a Schottky barrier diode of size 2512 (length×breadth=2.5 mm×1.2 mm), and a p channel type MOSFET of size 0604 (length×breadth=0.6 mm×0.4 mm), respectively.

As shown in FIG. 7, the Schottky barrier diodes of (1) and (2) are required to be enlarged from size 1006 to size 2512 in order to restrain the power consumption in accordance with the consumption current of an IC that is tending upward, whereas the MOSFET is low in power consumption although it has size 0604 that is considerably smaller than size 2512.

Therefore, if the semiconductor device 1 is used by being connected to the IC 46, it is possible to pass a forward current through a transistor structure that has a smaller loss and that is lower in power consumption than a diode, and therefore it is possible to employ a small-sized chip. As a result, it is possible to achieve space-saving if the semiconductor device 1 is used as a protecting element of the IC 46 of electronic equipment or the like.

On the other hand, if a load that is controlled by the IC 46 is inductive, a counter electromotive force occurs in the load when an electric current flowing through the load is shut off. Because of this counter electromotive force, there is a case in which a voltage by which the p+ type-source-region-25 side becomes positive (+) is applied between the p+ type source region 25 and the p− type drain region 23. In this case, a reverse bias is applied to the parasitic diode 51, and therefore an electric current does not flow through an internal circuit of the IC 46, and, as a result, it is possible to protect the IC 46. At this time, the reverse bias is also applied to the pn junction portion 36 of the voltage-regulator diode 29. Therefore, when the counter electromotive force of the load is large or when a large voltage, such as static electricity or surge voltage, is applied, the voltage-regulator diode 29 undergoes a Zener breakdown, and a reverse current flows to the gate side (ground potential side) through the voltage-regulator diode 29, and therefore it is possible to prevent a heavy electric current from flowing to the IC 46.

Accordingly, if the semiconductor device 1 is used as a protecting element of the IC 46 of electronic equipment or the like, it is possible to develop reverse voltage prevention and overvoltage protection with respect to the IC 46 although its power consumption is low, and therefore it is possible to maintain a protective function as a protecting element. Moreover, the transistor structure and the voltage-regulator diode 29 are unified into a single-chip configuration, and therefore it is possible to achieve more excellent space-saving than in a case in which these structure and diode are mounted as different chips.

On the other hand, the power consumption becomes higher in proportion to a decrease in size of the diode as shown in FIG. 7, and therefore, in the semiconductor device 1 that has been reduced in size, it is preferable to consider the power consumption (loss) of the voltage-regulator diode 29.

Figure 8:
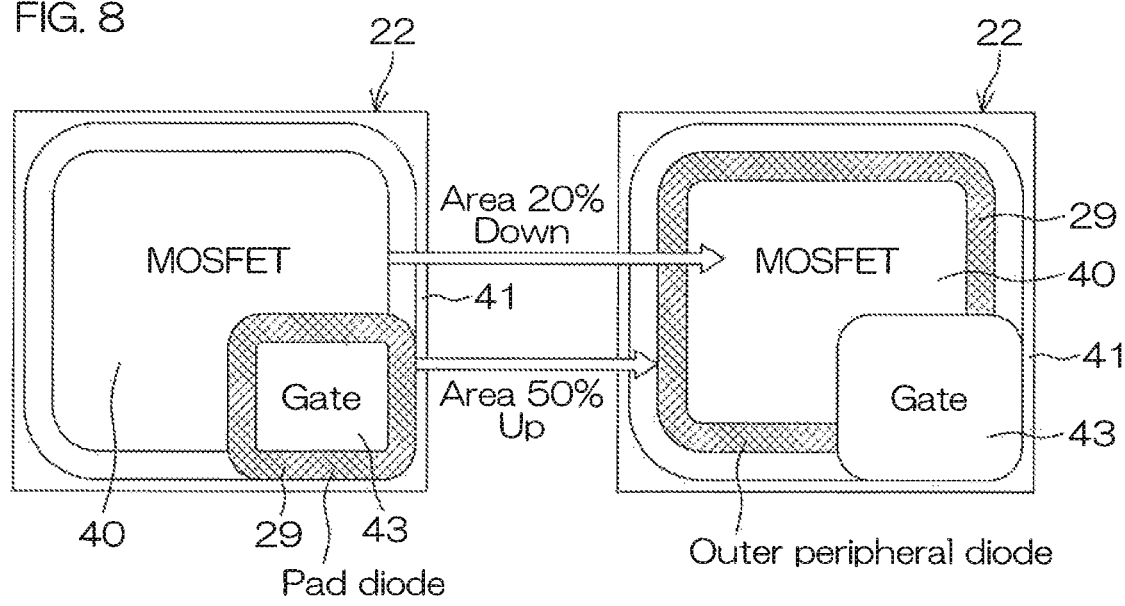
FIG. 8 is a view to describe a difference between the effective area of an outer peripheral diode and that of a pad diode.
Figure 9:
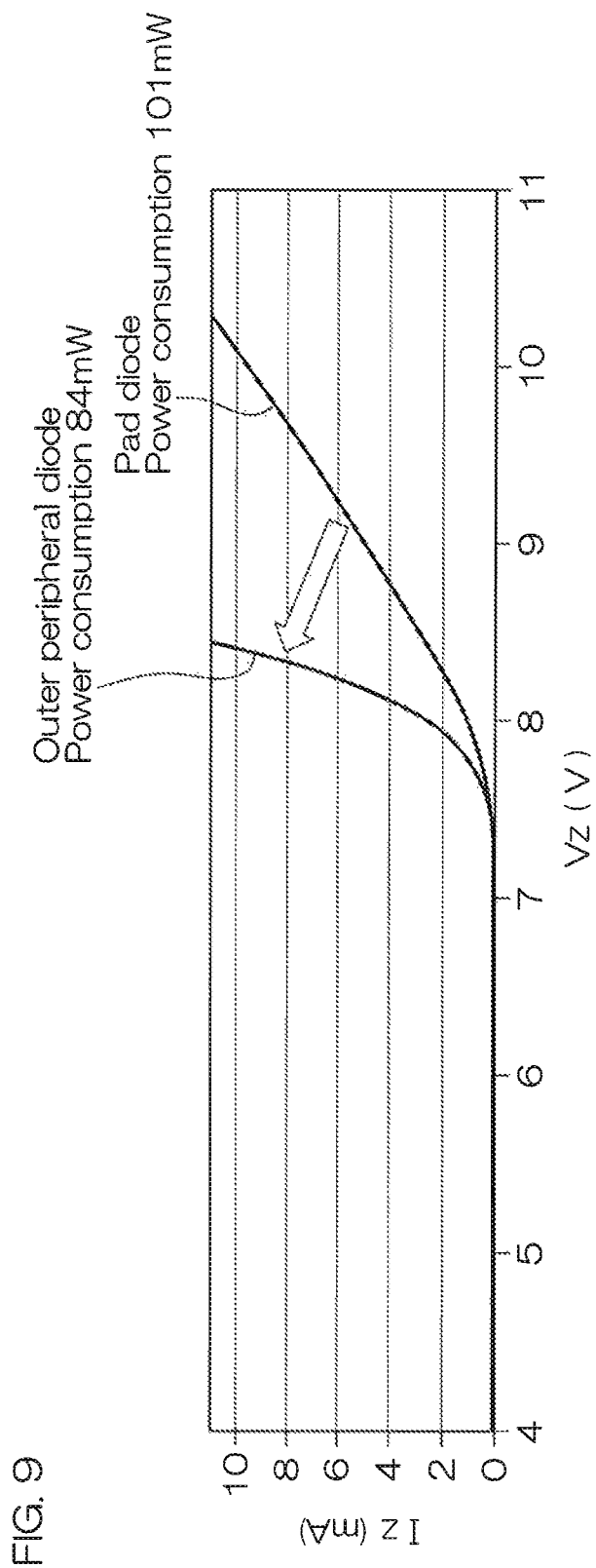
FIG. 9 is a view to make a comparison between the power consumption of the outer peripheral diode and that of the pad diode.

Here, referring to FIG. 8 and FIG. 9, a description will be given of the loss reduction of the voltage-regulator diode 29 in the semiconductor device 1 according to the present preferred embodiment. FIG. 8 is a view to describe a difference between the effective area of an outer peripheral diode and that of a pad diode. FIG. 9 is a view to make a comparison between the power consumption of the outer peripheral diode and that of the pad diode. In FIG. 8, a flat-surface arrangement of the semiconductor element 2 required to be described in this section is emphatically shown, and therefore FIG. 8 differs from FIG. 1 in magnitude, shape, etc.

As shown in FIG. 8, in the semiconductor element 61 depicted on the left side of the drawing sheet, the voltage-regulator diode 29 is arranged as a pad diode formed at an outer periphery of the gate pad 43. On the other hand, the semiconductor element 2 depicted on the right side of the drawing sheet is arranged as the outer peripheral diode described above. In this case, if the voltage-regulator diode 29 is arranged as the outer peripheral diode, the area of the pn junction portion 36 (see FIG. 4 and FIG. 5) makes an increase of 50%, for example, with respect to a case in which the voltage-regulator diode 29 is arranged as the pad diode although it depends on the size of the semiconductor element 2, the size of the gate pad 43, or the size of the like. As a result, it is possible to reduce the junction resistance of the pn junction portion 36, and hence is possible to reduce the power consumption from 101 mW to 84 mW as shown in FIG. 9. In other words, it is possible to reduce a loss in the voltage-regulator diode 29, and hence is possible to prevent the voltage-regulator diode 29 from undergoing a thermal breakdown, and is possible to raise the reliability of the semiconductor device 1. Concrete numerical values of the power consumption shown in FIG. 9 are an example mentioned to describe the effect of the loss reduction.

While it is possible to reduce the loss of the voltage-regulator diode 29, the voltage-regulator diode 29 is disposed so as to surround the active region 40, and therefore the disposition region of a cell having a transistor structure is further limited than in a case in which the pad diode is employed. For example, if the area of the pn junction portion is increased by 50%, a decrease of 20% will be anticipated with respect to the area of the active region 40.

Figure 10A:
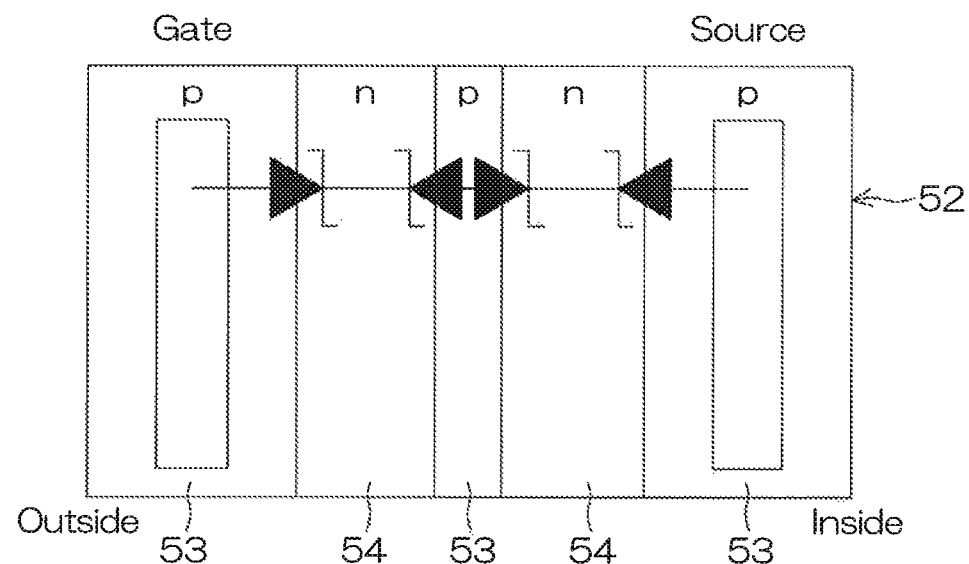
FIG. 10A and FIG. 10B are views to describe a structural difference between a voltage-regulator diode and an ESD protection diode.

However, the anticipated value of a reduction of the area of the active region 40 in FIG. 8 is based on the structure of the semiconductor element in which a two-way Zener diode 52 is mounted in order to protect a transistor structure like an ESD protection diode shown as a reference structure of FIG. 10A. In this structure, a two-way Zener diode 52 has a repetitive structure of a plurality of p type portions 53 and n type portions 54, and therefore a comparatively-wide diode disposition space is required.

Figure 10B:
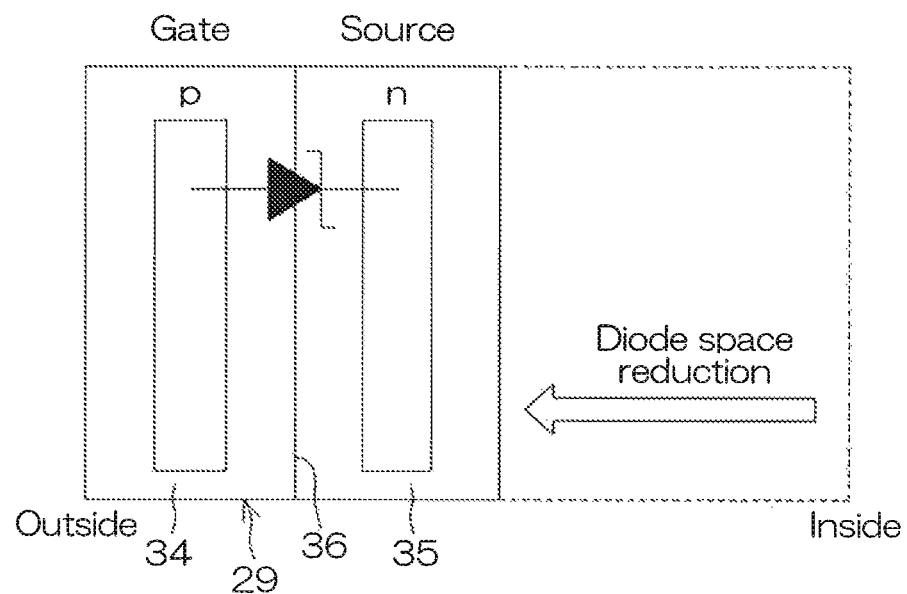
Figure 11:
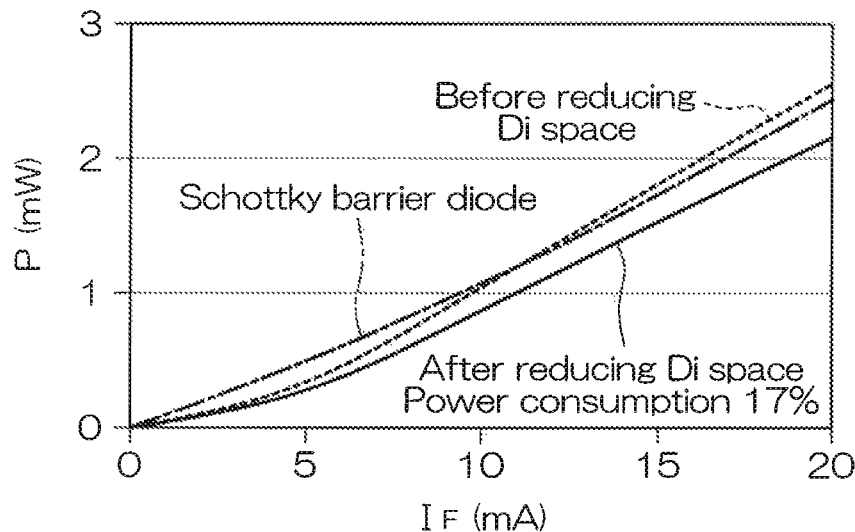
FIG. 11 is a view to describe the reduction effect of power consumption of a MOSFET in which a space for the outer peripheral diode has been reduced.
Figure 12:
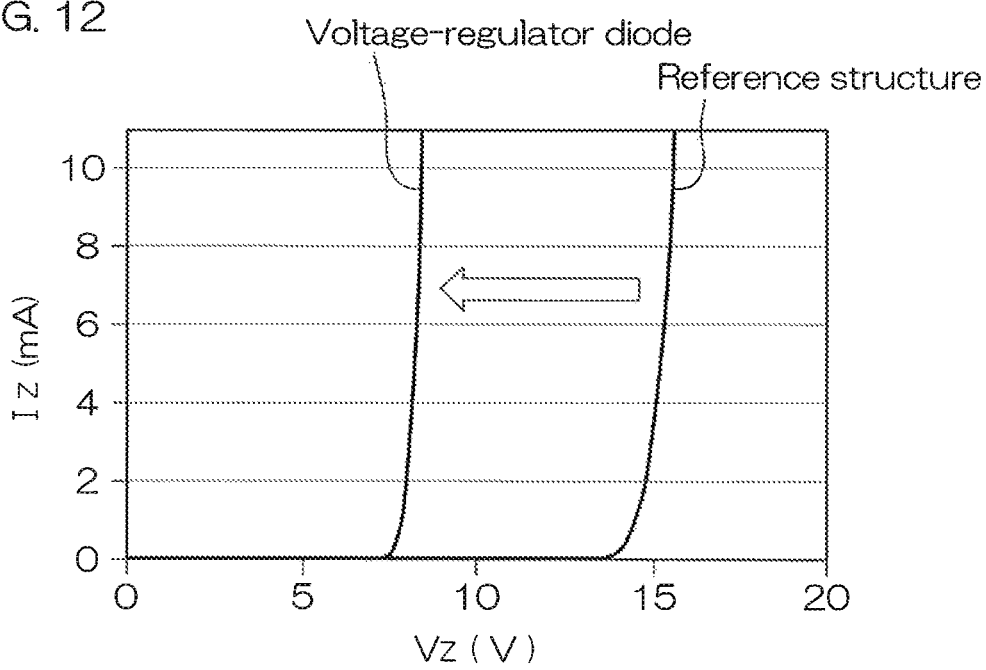
FIG. 12 is a view to make a comparison between the breakdown voltage of the voltage-regulator diode and that of the ESD protection diode.

On the other hand, the voltage-regulator diode 29 of the present preferred embodiment is composed of the p type portion 34 and the n type portion 35 that are adjacent to each other and that serve as a pair as shown in FIG. 10B, and therefore it is possible to narrow the diode disposition space, and it is possible to allot a space corresponding to a reduction created by the narrowness for a cell disposition space having a transistor structure. As a result, as shown in FIG. 11, it is possible to reduce the power consumption of the transistor (MOSFET) by, for example, 17%, and it is also possible to keep the power consumption of the transistor at a low level. Additionally, the voltage-regulator diode 29 composed of the p and n type portions 34 and 35 serving as a pair makes it possible to make the breakdown voltage Vz lower than the two-way Zener diode 52.

Figure 13:
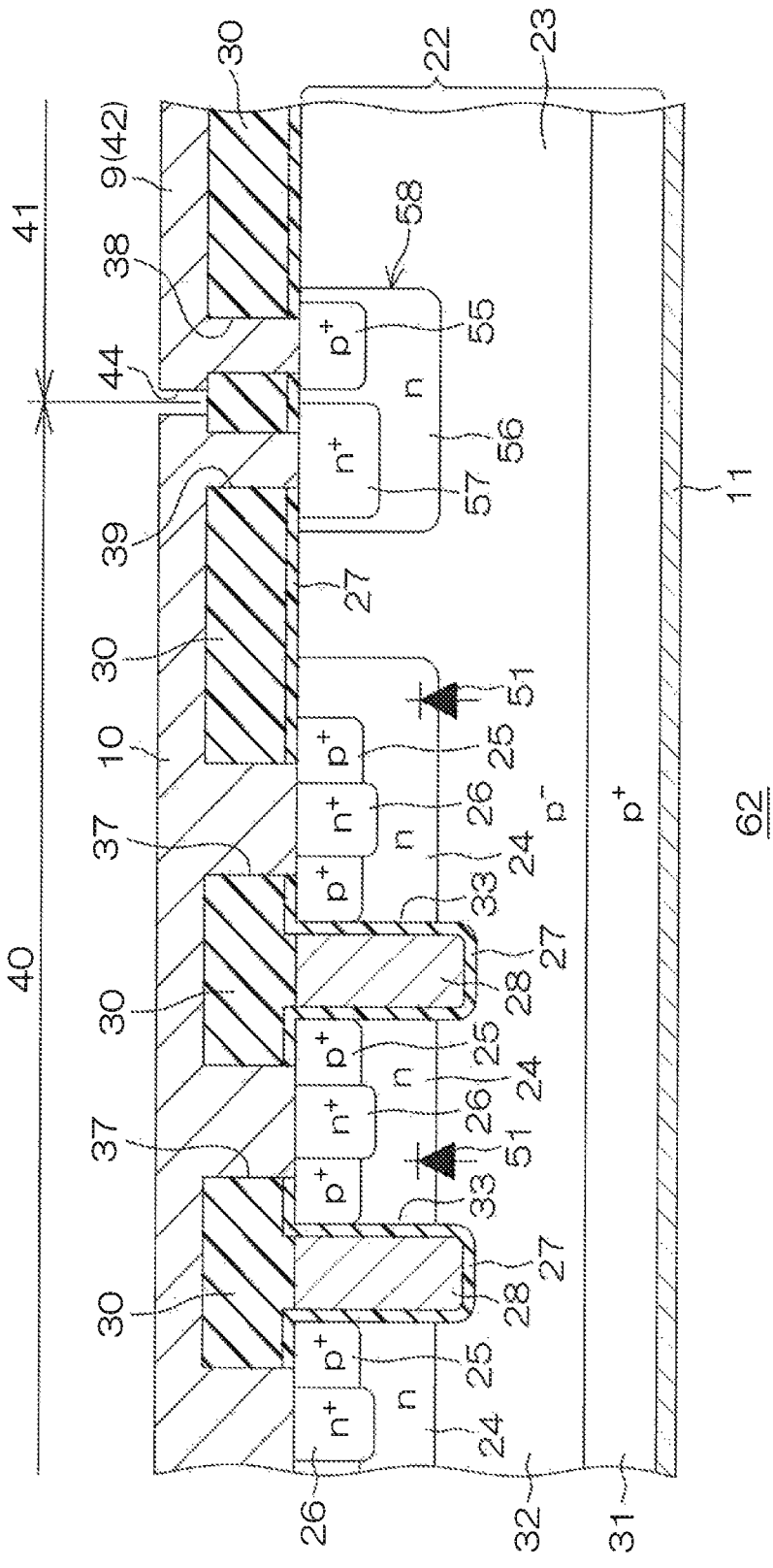
FIG. 13 is a view showing another form of the semiconductor element of FIG. 4.

As an example, the voltage-regulator diode according to one preferred embodiment of the present invention may be a voltage-regulator diode 58 composed of a $p^+$ type impurity region 55 and an n type impurity region 56 both of which serve as a pair and both of which are disposed in the $p^-$ type epitaxial layer 32 like a semiconductor element 62 of FIG. 13. In FIG. 13, an $n^+$ type impurity region 57 formed at a surface part of the n type impurity region 56 is an impurity region to make contact with the n type impurity region 56.

Figure 14:
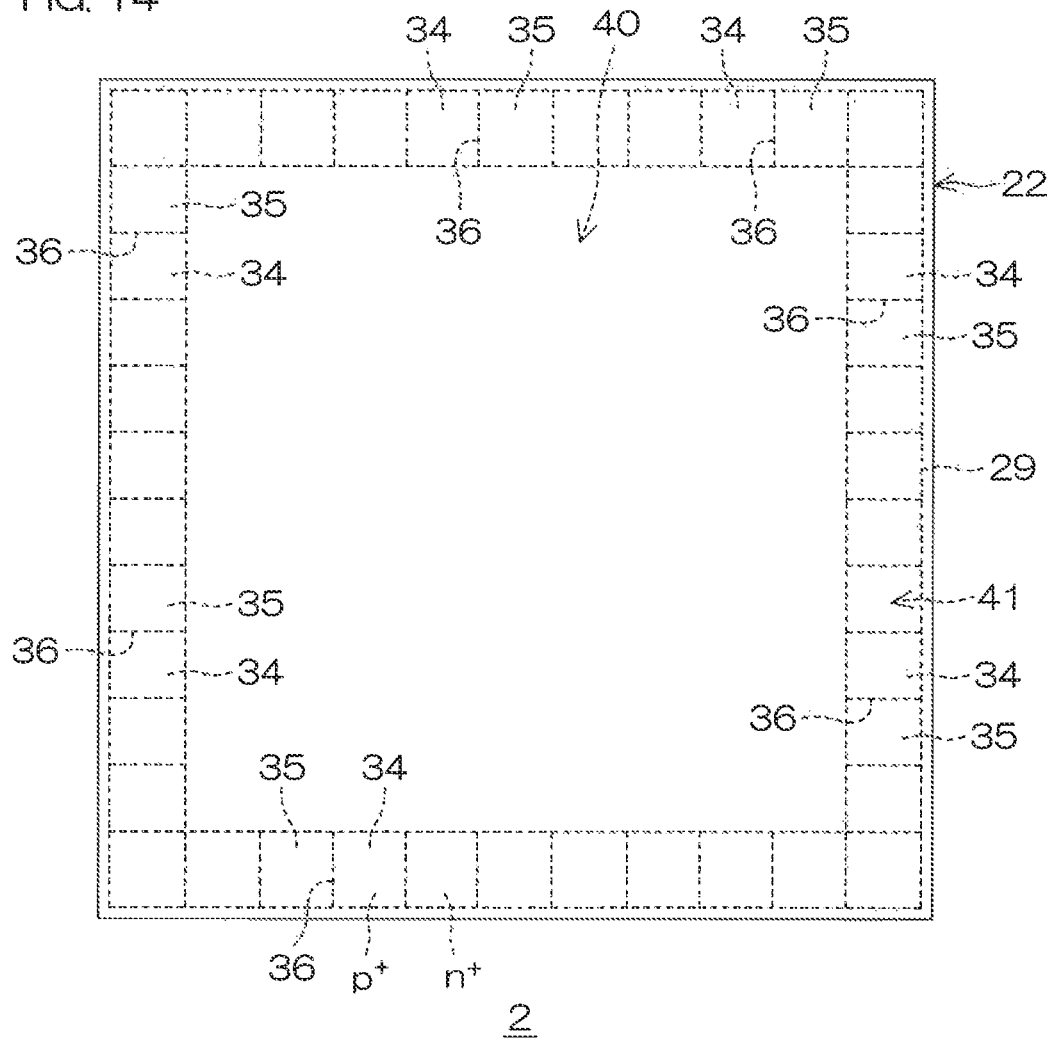
FIG. 14 is a view showing another form of the semiconductor element of FIG. 4.

Additionally, the voltage-regulator diode 29 may be made of a repetitive structure of the p type portion 34 and the n type portion 35 that are alternately disposed along the outer peripheral region 41 as shown in FIG. 14. In this case, there is a need to, from the source side and from the gate side, make contact with each of the plurality of p type portions 34 and n type portions 35 separated from each other.

Additionally, the transistor structure of the semiconductor element 2 may be a trench planar gate structure without being limited to the trench gate structure.

Figure 15:
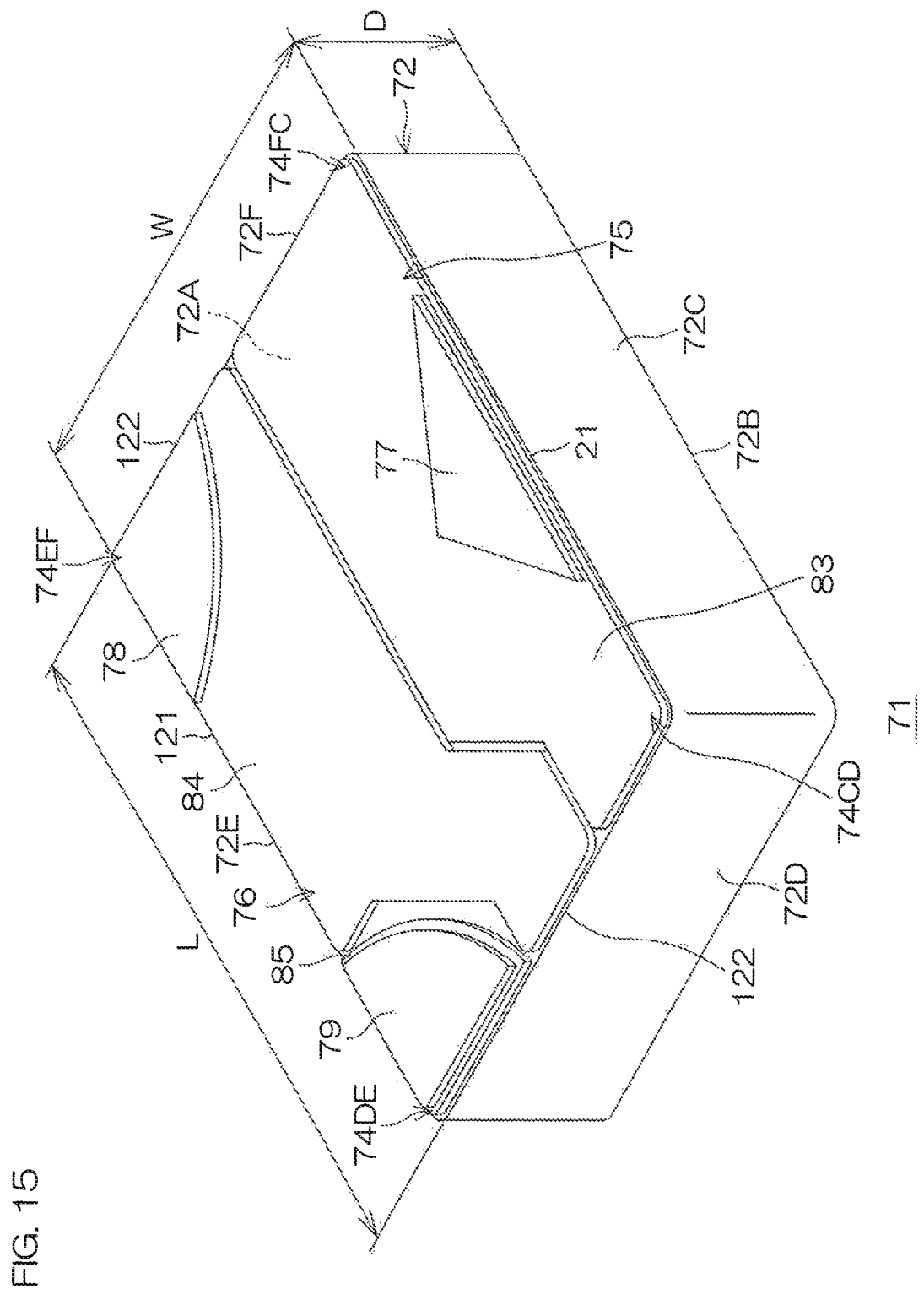
FIG. 15 is a perspective view of a semiconductor device according to another preferred embodiment of the present invention.
Figure 19:
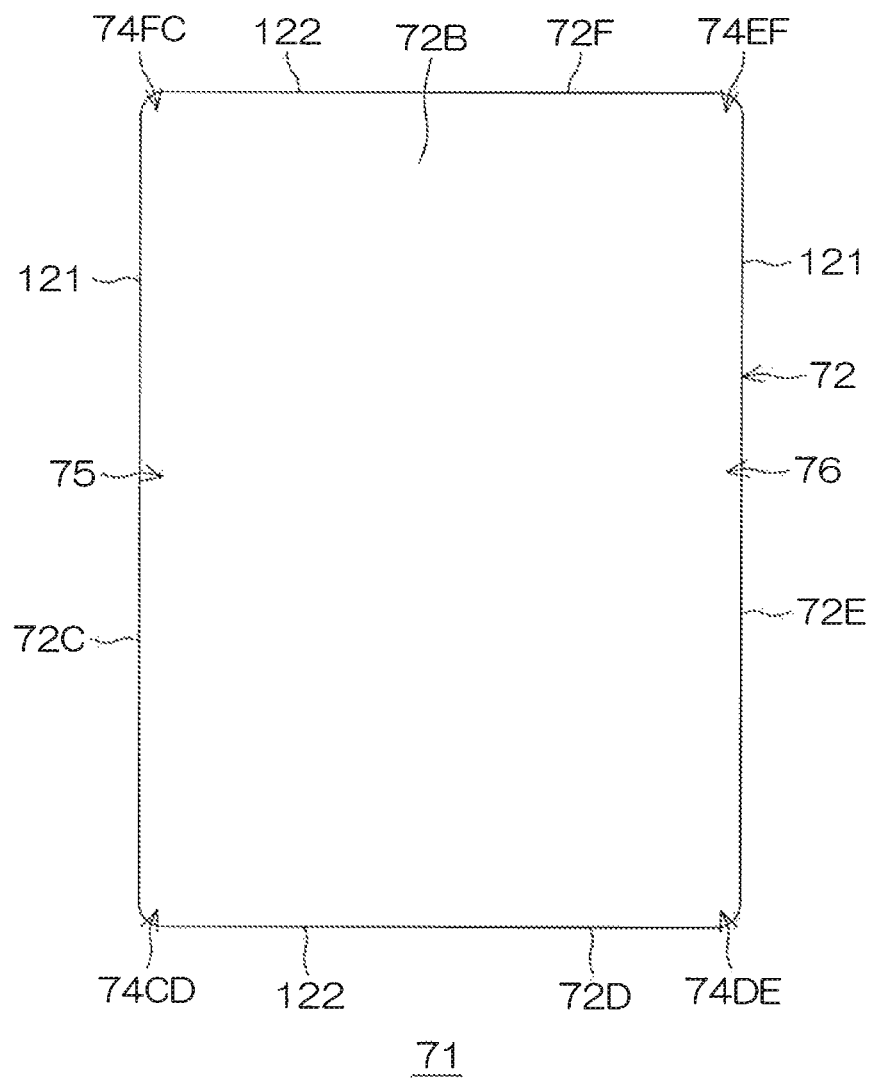
FIG. 19 is a bottom view of the semiconductor device of FIG. 15.
Figure 20:
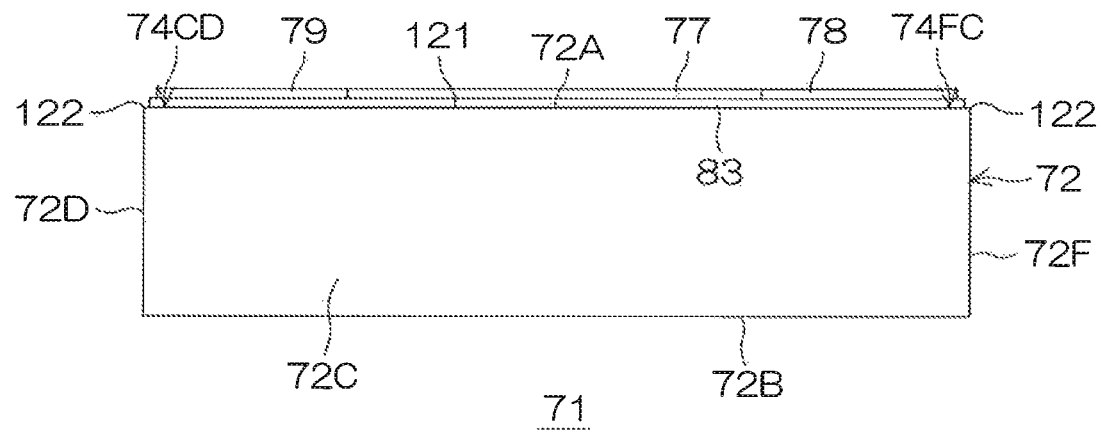
FIG. 20 is a right side view of the semiconductor device of FIG. 15.
Figure 21:
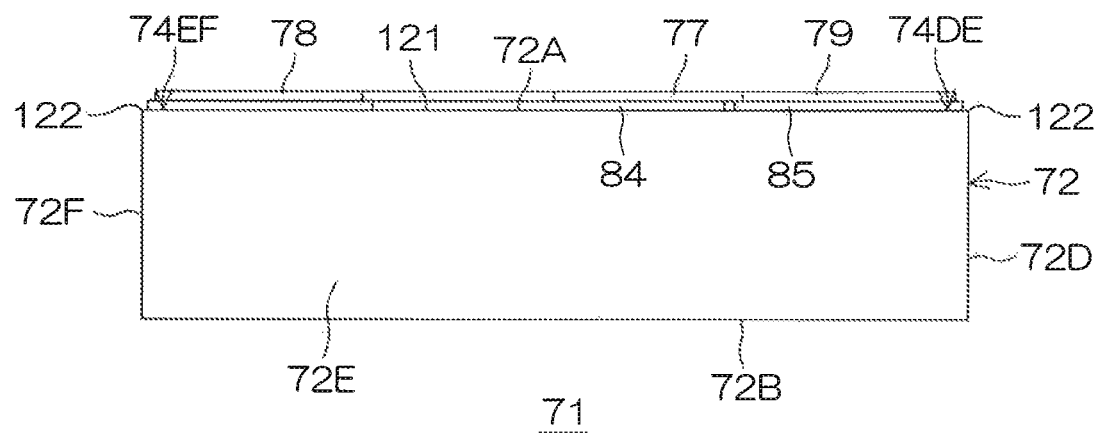
FIG. 21 is a left side view of the semiconductor device of FIG. 15.
Figure 22:
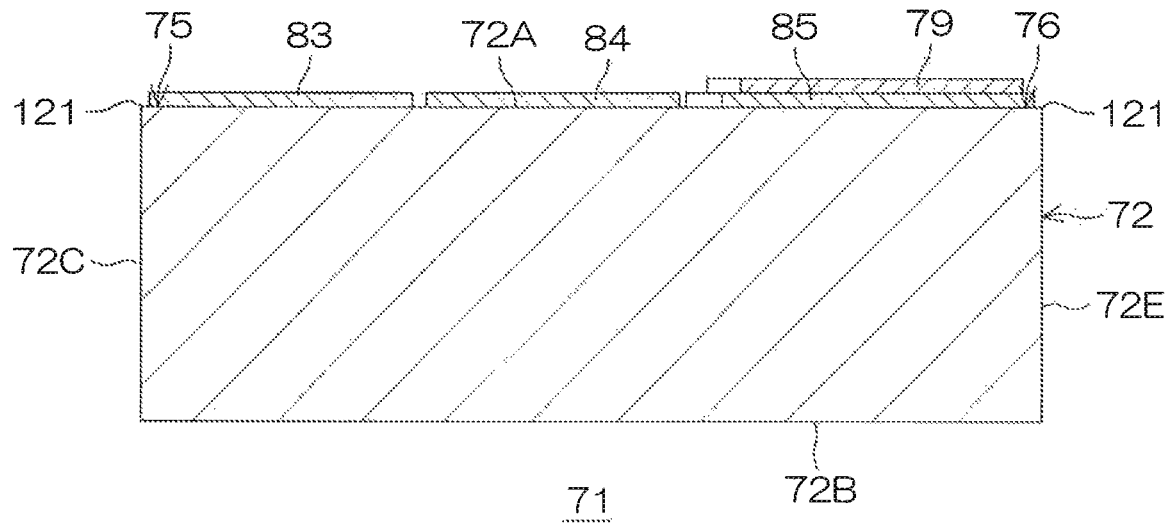
FIG. 22 is a view showing a cross section in a cutting plane along line XXII-XXII of FIG. 18.

Next, other preferred embodiments of the semiconductor device will be described. FIG. 15 is a perspective view of a semiconductor device 71 according to another preferred embodiment of the present invention. FIG. 16 is a front view of the semiconductor device 71. FIG. 17 is a back view of the semiconductor device 71. FIG. 18 is a plan view of the semiconductor device 71. FIG. 19 is a bottom view of the semiconductor device 71. FIG. 20 is a right side view of the semiconductor device 71. FIG. 21 is a left side view of the semiconductor device 71. FIG. 22 is a view showing a cross section in a cutting plane along line XXII-XXII of FIG. 18.

The semiconductor device 71 has a package structure of WL-CSP (Wafer Level-Chip Size Package). In other words, the semiconductor device 71 has a structure in which the semiconductor element 2 described above is used as a chip size level package, and includes a semiconductor substrate 72 formed in a rectangular shape in a plan view as an example of the semiconductor layer 22 described above, and is formed in substantially the same size as the external shape size of the semiconductor substrate 72.

For example, as shown in FIG. 15, the length L of the semiconductor device 71 is less than 0.50 mm (preferably, 0.40 mm or more), the width W thereof is less than 0.40 mm (preferably, 0.30 mm or more), and the thickness D thereof is less than 0.15 mm (preferably, 0.10 mm or more).

For example, if the length L of the semiconductor device 71 is 0.50 mm and if the width W thereof is 0.40 mm, the plane area of the semiconductor device 71 is 0.20 mm². If the length L of the semiconductor device 71 is 0.40 mm and if the width W thereof is 0.30 mm, the plane area of the semiconductor device 71 is 0.12 mm². In other words, the semiconductor device 71 has a very small package structure of size 0403.

From the fact that the thickness of the semiconductor device 71 is less than 0.15 mm, it is possible to reduce the amount of protrusion from an ordinary position of a side surface of the semiconductor device 71 even if the semiconductor device 71 is inclinedly mounted. This makes it possible to prevent the semiconductor device 71 from making contact with an adjoining semiconductor device even when the semiconductor device 71 is mounted at a high density.

When a description is hereinafter given of the shape and size of the semiconductor device 71, of the shape and size of the semiconductor substrate 72, of the disposition positions of other components, and of the like, the subject of this description may be replaced with another from the fact that the semiconductor device 71 has the package structure of WL-CSP. For example, the semiconductor substrate 72 formed in a quadrangular shape in a plan view may be replaced with the semiconductor device 71 formed in a quadrangular shape in a plan view. The description of a pad being disposed at a peripheral edge of the semiconductor substrate 72 may be replaced with the description of a pad being disposed at a peripheral edge of the semiconductor substrate 71.

The semiconductor substrate 72 formed in a rectangular parallelepiped shape may have an obverse surface 72A, a reverse surface 72B on the side opposite to the obverse surface 72A, and four side surfaces 72C, 72D, 72E, and 72F between the obverse surface 72A and the reverse surface 72B, and the obverse surface 72A and the side surfaces 72C to 72F may be covered with a surface insulating film (not shown). Among the four side surfaces 72C to 72F of the semiconductor substrate 72, the side surfaces 72C and 72E are side surfaces along long sides 121 of the semiconductor substrate 72, respectively, and the side surfaces 72D and 72F are side surfaces along short sides 122 of the semiconductor substrate 72, respectively. Corner portions 74CD, 74DE, 74EF, and 74FC of the semiconductor substrate 72 are formed at intersection portions of adjoining side surfaces 72C to 72F, respectively.

In the obverse surface 72A of the semiconductor substrate 72, a drain pad 77 (first pad) is disposed at a first peripheral edge portion 75 along the side surface 72C on the long-side-121 side. The drain pad 77 is formed at a middle apart from the corner portions 74CD and 74FC of both ends of the first peripheral edge portion 75, and a region of a predetermined interval (e.g., about 0.1 mm to 0.15 mm) is provided between the drain pad 77 and each of the corner portions 74CD and 74FC.

On the other hand, a source pad 78 (second pad) is disposed at the corner portion 74EF of an end of the second peripheral edge portion 76 of the semiconductor substrate 72 that faces the first peripheral edge portion 75, and a gate pad 79 (third pad) is disposed at the corner portion 74DE of the other end of the second peripheral edge portion 76.

Next, a description will be given of the layout and shape of the drain pad 77, the layout and shape of the source pad 78, and the layout and shape of the gate pad 79.

The drain pad 77 is disposed in an outer region of a first circular arc 80 and in an outer region of a second circular arc 81. The first circular arc 80 has a radius equal to the length (width W of FIG. 15) of the short side 122 of the semiconductor substrate 72. A center of the first circular arc 80 is coincided with a vertex V1 of the corner portion 74EF of the end of the second peripheral edge portion 76. The second circular arc 81 has a radius equal to the length (width W of FIG. 15) of the short side 122 of the semiconductor substrate 72. A center of the second circular arc 81 is coincided with a vertex V2 of the corner portion 74DE of the other end of the second peripheral edge portion 76. The first and second circular arc 80, 81 are virtual lines which are depicted on the obverse surface 72A of the semiconductor substrate 72 as shown in FIG. 18. The drain pad 77 is formed in a triangular shape having two sides that are a pair of tangents drawn to the first and second circular arcs 80 and 81, respectively, from an intersection 82 between the first circular arc 80 and the second circular arc 81 in those outer regions.

On the other hand, the source pad 78 is formed in a sectorial shape that has the same center as the first circular arc 80. The radius R1 of the source pad 78 is, for example, 0.07 mm to 0.13 mm (preferably, 0.10 mm or more). For example, if the radius R1 is 0.07 mm, the area of the source pad 78 is $3.85 \times 10^{-3}$ mm$^2$, and, if the radius R1 is 0.10 mm, the area of the source pad 78 is $7.85 \times 10^{-3}$ mm$^2$.

The gate pad 79 is formed in a sectorial shape that has the same center as the second circular arc 81. The radius R2 of the gate pad 79 is, for example, 0.07 mm to 0.13 mm (preferably, 0.10 mm or more). For example, if the radius R2 is 0.07 mm, the area of the gate pad 79 is $3.85 \times 10^{-3}$ mm$^2$. If the radius R2 is 0.10 mm, the area of the gate pad 79 is $7.85 \times 10^{-3}$ mm$^2$.

A drain wiring film 83, a source wiring film 84, and a gate wiring film 85 are disposed between the drain pad 77, the source pad 78, the gate pad 79, and the semiconductor substrate 72, respectively. These films are each made of a metallic layer, such as AlCu layer, and a barrier layer (e.g., Ti, TiN, etc.) may be formed on the obverse surface and the reverse surface of the layer if needed. The drain wiring film 83, the source wiring film 84, and the gate wiring film 85 may be electrically connected to the p$^-$ type drain region 23, to the p$^+$ type source region 25, and to the gate electrode 28 mentioned above, respectively.

As shown in FIG. 18, the gate wiring film 85 is formed in a sectorial shape in a plan view that is a similar figure larger than the gates pad 79.

As shown in FIG. 18, the source wiring film 84 is formed so as to cover substantially half the region on the second-peripheral-edge-portion-76 side of the semiconductor substrate 72. In detail, it is formed on the side-surface-72F side in the longitudinal direction and on the side-surface-72C side in the width direction with respect to the gate wiring film 85 so as to avoid the gate wiring film 85. Therefore, the gate wiring film 85 formed in a sectorial shape in a plan view has its circular arc part adjacent to the source wiring film 84.

As shown in FIG. 18, the drain wiring film 83 is formed so as to cover substantially half the region on the first-peripheral-edge-portion-75 side of the semiconductor substrate 72. As a result, the source wiring film 84 and the drain wiring film 83 are respectively made of wiring films substantially equal in area to each other, and it is possible to make the wiring resistance on the source side and the wiring resistance on the drain side substantially equal to each other.

Next, referring to FIG. 23, a description will be given of how much the mounting area of the semiconductor device 71 can be reduced by the layout and shape of the drain pad 77, the layout and shape of the source pad 78, and the layout and shape of the gate pad 79 mentioned above.

FIG. 23 is a view to make a comparison between the chip size of the semiconductor device 71 and that of a semiconductor device 100 according to a reference example. For clarification, only reference signs necessary for a comparison among the reference signs of FIG. 15 to FIG. 22 are shown in FIG. 23, and the other reference signs are excluded.

First, if the source pad 78 and the gate pad 79 are disposed adjacently to each other in the short side 122 of the semiconductor substrate 72 as in the semiconductor device 100 of the reference example, the package size of the semiconductor device 100 is, for example, length L=0.6 mm and width W=0.4 mm. The reason is that at least a pitch P of 0.2 mm is secured as a distance between the source pad 78 and the gate pad 79 in order to avoid a source-to-gate short circuit in the short-side direction. Additionally, the drain pad 77 is formed in a shape from a corner portion at an end to a corner portion at the other end of the short side 122. Therefore, if the package size is reduced without changing the pad layout, the source-to-gate pitch P will become below 0.2 mm, and the problem of a source-to-gate short circuit will be caused when mounted. On the other hand, even if the source pad 78 and the gate pad 79 are disposed adjacently to each other in the long side 121, it is difficult to resolve the problem of a short circuit between the pads. The reason is that, in this pad layout, the drain pad 77 assumes a shape from a corner portion at an end to a corner portion at the other end of the long side 121 as shown by reference sign "77"' and the broken line. Therefore, as a result of the decrease of the package size, the problem of a source-to-drain short circuit or of a gate-to-drain short circuit is caused.

On the other hand, in the arrangement of the semiconductor device 71 mentioned above, the source pad 78 and the gate pad 79 are disposed adjacently to each other in the long side 121. Additionally, the drain pad 77 is disposed at the middle of the long side 121 of the semiconductor substrate 72, and a region of a predetermined interval is provided between the drain pad 77 and each of the corner portions 74CD and 74FC at both ends of the long side 121. This makes it possible to make a distance (pitch P1) between the drain pad 77 and the source pad 78 and a distance (pitch P2) between the drain pad 77 and the gate pad 79 longer than in the semiconductor device 100 of the reference example. Therefore, even if the package size of the semiconductor device 71 is reduced to be, for example, length L=0.44 mm and width W=0.32 mm, it is possible to keep the pitch P1 and the pitch P2 at 0.2 mm equal to the source-to-gate pitch P in the semiconductor device 100. In other words, the distance to be secured between the pads is 0.20/0.32=62.5% or more of the short side 122 of the package of the semiconductor device 71. If the short side 122 of the package is at least 0.40 mm, the distance to be secured between the pads is 0.20/0.40=50% or more of the short side 122 of the package of the semiconductor device 71. Additionally, if the package size of the semiconductor device 71 is $1.41\times10^{-1}$ mm 2 and if the pad radiuses R1 and R2 are each 0.10 mm, the pad area is $7.85\times10^{-3}$ mm$^2$, and therefore the area (pad area) of the source pad 78 and that of the gate pad 79 are each 5% or more of the package size. Therefore, it is possible to make the size of the semiconductor substrate smaller than the size of the semiconductor device 100 while avoiding a short circuit when mounted. This makes it possible to provide a semiconductor device reduced in size.

Additionally, in the semiconductor device 71, the drain pad 77 is disposed in the outer regions of the first and second circular arcs 80 and 81 each of which has a radius equal to the length of the short side 122 as shown in FIG. 18. Therefore, it is possible to secure a length corresponding to at least a difference between the length of the short side 122 of the semiconductor device 71 and each magnitude (width) of the source and gate pads 78 and 79 as the pitch P1 and as the pitch P2. Additionally, the drain pad 77 is formed in a triangular shape having two sides that are a pair of tangents drawn to the first and second circular arcs 80 and 81, respectively, from the intersection 82 between the first circular arc 80 and the second circular arc 81. This makes it possible to secure a junction area large enough for the drain pad 77 while reducing the semiconductor device 71 in size. Therefore, it is also possible to restrain the fastening strength from being weakened when the semiconductor device 71 is mounted.

With respect to the secureness of the fastening strength when the semiconductor device 71 is mounted, furthermore, the source pad 78 and the gate pad 79 are formed in sectorial shapes that have the same centers as the first and second circular arcs 80 and 81, respectively. This makes it possible to secure a junction area large enough for each of the source and gate pads 78 and 79 while securing a length of 0.2 mm as each of the pitches P1 and P2.

As described above, according to the semiconductor device 71, it is possible to reduce the mounting area by about 40% in comparison with the semiconductor device 100 of the reference example while sufficiently securing a pitch between the adjoining pads and a junction area of the pads.

Although one preferred embodiment of the present invention has been described as above, the present invention can be embodied in other modes.

For example, in the package form shown in FIG. 15 to FIG. 22, a lateral MISFET in which a source region and a drain region with an interval therebetween are disposed in the lateral direction along the obverse surface 72A may be formed on the semiconductor substrate 72.

Besides, various design changes can be made within the scope of the subject matter described in the claims.

What is claimed is:

1. A semiconductor device comprising:
   a semiconductor layer that has a transistor structure including a source region of a first conductivity type, a drain region of the first conductivity type, a body region of a second conductivity type between the source region and the drain region, and a gate electrode facing the body region; and
   a voltage-regulator diode disposed at the semiconductor layer, the voltage-regulator diode having a first portion of the second conductivity type connected to the source region through a first conductive path and a second portion of the first conductivity type electrically connected to the gate electrode by a metal member through a second conductive path electrically separated from the first conductive path, the voltage-regulator diode having a capability allowing a reverse current to flow only in a first direction,
   wherein the transistor structure and the voltage-regulator diode are unified into a single-chip configuration, and
   the voltage-regulator diode is made of an impurity region disposed in the semiconductor layer.

2. The semiconductor device according to claim 1, wherein the semiconductor layer includes an active region including the transistor structure and an outer peripheral region surrounding the active region, and
   the voltage-regulator diode includes an outer peripheral diode disposed along the outer peripheral region.

3. The semiconductor device according to claim 2, wherein, in the outer peripheral diode, the second portion and the first portion are each formed in an annular shape surrounding the active region, and
   a pn junction portion between the second portion and the first portion has an integral structure formed in an annular shape surrounding the active region.

4. The semiconductor device according to claim 3, wherein the second portion and the first portion each have a width equal to each other.

5. The semiconductor device according to claim 3, wherein, in the outer peripheral diode, the first portion is disposed at a more inward side than the second portion.

6. The semiconductor device according to claim 1, wherein a breakdown voltage of the voltage-regulator diode is 8 V or less.

7. The semiconductor device according to claim 1, the semiconductor device having a length-breadth chip size of 0.6 mm×0.4 mm or less.

8. The semiconductor device according to claim 2, wherein
   the metal member includes a gate finger surrounding the active region, and
   the second portion is in direct contact with the gate finger.

9. The semiconductor device according to claim 1, wherein
   the first conductive path includes a source metal connected to the source region and the body region, and
   the metal member includes a gate finger surrounding the source metal.

10. A semiconductor device comprising:
    a semiconductor layer that has a transistor structure including a source region of a first conductivity type, a drain region of the first conductivity type, a body region of a second conductivity type between the source region and the drain region, and a gate electrode facing the body region; and
    a voltage-regulator diode disposed at the semiconductor layer, the voltage-regulator diode having a first portion of the second conductivity type connected to the source region through a first conductive path and a second portion of the first conductivity type electrically connected to the gate electrode by a metal member through a second conductive path electrically separated from the first conductive path,
    wherein the transistor structure and the voltage-regulator diode are unified into a single-chip configuration,
    the first conductive path includes a source metal connected to the source region and the body region,
    the metal member includes a gate finger surrounding the source metal, and the voltage-regulator diode is made of an impurity region disposed in the semiconductor layer.

11. The semiconductor device according to claim 10, wherein the semiconductor layer includes an active region including the transistor structure and an outer peripheral region surrounding the active region, and the voltage-regulator diode includes an outer peripheral diode disposed along the outer peripheral region.

12. The semiconductor device according to claim 11, wherein, in the outer peripheral diode, the second portion and the first portion are each formed in an annular shape surrounding the active region, and a pn junction portion between the second portion and the first portion has an integral structure formed in an annular shape surrounding the active region.

* * * * *